United States Patent
Goto et al.

(10) Patent No.: US 9,862,847 B2
(45) Date of Patent: Jan. 9, 2018

(54) INKJET DISCHARGE METHOD, PATTERN FORMATION METHOD, AND PATTERN

(71) Applicant: FUJIFILM Corporation, Tokyo (JP)

(72) Inventors: Yuichiro Goto, Haibara-gun (JP);
Tadashi Oomatsu, Haibara-gun (JP);
Hirotaka Kitagawa, Haibara-gun (JP);
Yuichiro Enomoto, Haibara-gun (JP);
Kenichi Kodama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 38 days.

(21) Appl. No.: 14/757,424

(22) Filed: Dec. 23, 2015

(65) Prior Publication Data

US 2016/0122563 A1    May 5, 2016

Related U.S. Application Data

(63) Continuation of application No. PCT/JP2014/066520, filed on Jun. 23, 2014.

(30) Foreign Application Priority Data

Jun. 27, 2013  (JP) .................................. 2013-134401

(51) Int. Cl.
| | |
|---|---|
| C09D 11/30 | (2014.01) |
| B41J 2/01 | (2006.01) |
| C09D 11/106 | (2014.01) |
| G03F 7/00 | (2006.01) |
| C09D 11/101 | (2014.01) |
| C09D 11/38 | (2014.01) |
| C08G 65/00 | (2006.01) |
| C08G 65/332 | (2006.01) |
| C09D 133/06 | (2006.01) |
| C08K 5/06 | (2006.01) |
| C08K 5/103 | (2006.01) |
| C08K 5/12 | (2006.01) |

(52) U.S. Cl.
CPC ................ *C09D 11/30* (2013.01); *B41J 2/01* (2013.01); *C08G 65/007* (2013.01); *C08G 65/3322* (2013.01); *C09D 11/101* (2013.01); *C09D 11/106* (2013.01); *C09D 11/38* (2013.01); *C09D 133/06* (2013.01); *G03F 7/0002* (2013.01); *C08K 5/06* (2013.01); *C08K 5/103* (2013.01); *C08K 5/12* (2013.01)

(58) Field of Classification Search
CPC ..................................................... C09D 11/30
See application file for complete search history.

(56) References Cited

U.S. PATENT DOCUMENTS

2009/0142507 A1*  6/2009  Yokoi ................... C08F 226/06
427/504

2010/0302326 A1* 12/2010 Morohoshi ............ B41J 2/1433
347/86
2011/0183127 A1*  7/2011 Kodama ................ B82Y 10/00
428/195.1
2011/0241264 A1* 10/2011 Yokoi ................... C09D 11/101
264/494
2014/0154471 A1  6/2014 Kodama et al.

FOREIGN PATENT DOCUMENTS

| JP | 2010-179519 A | 8/2010 |
|---|---|---|
| JP | 2011-021113 A | 2/2011 |
| JP | 2011-051222 A | 3/2011 |
| JP | 2011-136542 A | 7/2011 |
| JP | 2012-067203 A | 4/2012 |
| JP | 2012-076310 A | 4/2012 |
| JP | 2013-036027 A | 2/2013 |
| WO | 2005/000552 A2 | 1/2005 |

OTHER PUBLICATIONS

Office Action dated Dec. 6, 2016, from the Japanese Patent Office in counterpart Japanese Application No. 2013-134401.
International Preliminary Report on Patentability issued from the International Bureau in counterpart Application No. PCT/JP2014/066520, dated Jan. 7, 2016.
International Search Report of PCT/JP2014/066520 dated Sep. 30, 2014 [PCT/ISA/210].
Written Opinion of PCT/JP2014/066520 dated Sep. 30, 2014 [PCT/ISA/237].
Office Action dated Apr. 25, 2017 issued by the Korean Intellectual Property Office in counterpart Korean Application No. 10-2015-7036543.
Office Action dated Sep. 20, 2017 from the Korean Intellectual Property Office, in counterpart Korean Application No. 10-2015-7036543.

* cited by examiner

*Primary Examiner* — Bruce H Hess
*Assistant Examiner* — Sathavaram I Reddy
(74) *Attorney, Agent, or Firm* — Sughrue Mion, PLLC

(57) ABSTRACT

The present invention provides a discharge method which makes it possible to appropriately perform discharge even when a head for discharging microdroplets having a size of equal to or less than 6 pL that is necessary for controlling a residual film (forming a thin film and achieving uniformity) is used, and makes it possible to obtain an excellent pattern having excellent release properties. The discharge method is an inkjet discharge method including discharging a photo-curable composition in the form of liquid droplets having a size of equal to or less than 6 pL, in which the composition satisfies the following (a) to (c), (a) containing a fluorine-containing material in a proportion of equal to or less than 4% by mass of the composition; (b) having a surface tension of 25 mN/m to 35 mN/m; and (c) containing a solvent having a boiling point of equal to or less than 200° C. in an amount of 5% by mass of the composition.

8 Claims, No Drawings

INKJET DISCHARGE METHOD, PATTERN FORMATION METHOD, AND PATTERN

CROSS-REFERENCE TO RELATED APPLICATIONS

This application is a Continuation of PCT International Application No. PCT/JP2014/066520 filed on Jun. 23, 2014 which claims priority under 35 U.S.C §119(a) to Japanese Patent Application No. 2013-134401 filed on Jun. 27, 2013. Each of the above application(s) is hereby expressly incorporated by reference, in its entirety, into the present application.

BACKGROUND OF THE INVENTION

1. Field of the Invention

The present invention relates to an inkjet discharge method and a pattern formation method using the discharge method. Furthermore, the present invention relates to a pattern formed by the pattern formation method.

2. Description of the Related Art

The imprinting method is a technique of transferring a fine pattern to a material by pressing a metal mold (generally referred to as a mold or a stamp), in which a pattern is formed, on the material. By using the imprinting method, a precise fine pattern can be prepared in a simple manner. Therefore, in recent years, the application of the method in various fields has been expected. Particularly, a nanoimprinting technique forming a nano-order fine pattern has drawn attention.

As the imprinting method, those called a thermal imprinting method and a photoimprinting method according to the transfer method have been suggested. In the thermal nanoimprinting method, a fine pattern is formed by pressing a mold on a thermoplastic resin heated to a temperature of equal to or higher than the glass transition temperature, cooling the resin, and then releasing the mold. In this method, various materials can be selected. However, the method also has problems in that a high pressure is required at the time of pressing, and a fine pattern is not easily formed because of thermal contraction or the like.

In contrast, in the photoimprinting method, in a state in which a mold is pressed on a photocurable composition, the composition is cured by light, and then the mold is released. In this method, high-pressure and high-temperature heating does not need to be performed for carrying out imprinting on an uncured substance, and a fine pattern can be prepared in a simple manner.

In the photoimprinting method, a substrate (subjected to adhesion processing if necessary) is coated with a photocurable composition, and then a mold prepared by using a light-transmitting material such as quartz is pressed on the composition. In a state in which the mold is pressed on the photocurable composition, the composition is cured by being irradiated with light, and then the mold is released. In this way, a cured substance to which an intended pattern has been transferred is prepared. In the photoimprinting method, in order to obtain a pattern which exhibits excellent transferability, the release properties between the mold and the photocurable composition needs to be improved. Furthermore, in a case in which micromachining is performed by using the transferred imprinting pattern as a mask, control of a residual film (forming a thin film and achieving uniformity) is required.

As the method for applying the photocurable composition onto the substrate, a spin coating method and an inkjet method are exemplified. Particularly, the inkjet method has drawn attention recently as the application method because loss of the photocurable composition is small.

As the method for improving the release properties, WO2005/000552A discloses adding a surfactant to the photocurable composition. In WO2005/000552A, a surfactant, which is localized in a mold, is added to the photocurable composition so as to control the interfacial affinity between the mold and the cured photocurable composition, thereby improving the release properties.

Furthermore, JP2011-021113A discloses a composition obtained by adding an oligomer-type surfactant to a photocurable composition at a high concentration.

Meanwhile, JP2012-67203A describes an ink discharge method for an inkjet.

SUMMARY OF THE INVENTION

As a result of examining WO2005/000552A, the inventors of the present invention found that the surfactant ZONYL FSO-100 (DuPont) or the like described in the document is poorly compatible with general polymerizable compounds. Therefore, the amount of the surfactant mixed in is substantially limited, and thus it is difficult for obtaining sufficient release properties.

In contrast, the inventors found that, in JP2011-021113A, because the oligomer-type surfactant is added at a high concentration, and thus the surface tension of the liquid increases, the discharge of ink by an inkjet method tends to be difficult. Particularly, they found that when a head for discharging microdroplets having a size of equal to or less than 6 pL that is necessary for controlling the residual film (forming a thin film and achieving uniformity) is used, such a tendency becomes marked.

Furthermore, JP2012-67203A describes the use of an inkjet device (DMP2831, manufactured by Dimatix, Inc.) which can set the size of microdroplets to be 1 pL and 10 pL.

However, as a result of examining the document in detail, the inventors found that when imprinting is performed by using the inkjet ink which contains a large amount of solvent as described in the document, due to the influence of the residual solvent, the control of uniformity of the residual film becomes difficult, or defects occur in a wide range.

The present invention aims to solve the aforementioned problems, and an object thereof is to provide a discharge method which makes it possible to appropriately perform discharge even when a head for discharging microdroplets having a size of equal to or less than 6 pL that is necessary for controlling a residual film (forming a thin film and achieving uniformity) is used. Particularly, the object of the present invention is to provide a discharge method which makes it possible to obtain a pattern having excellent release properties and pattern formability.

Under the aforementioned circumstances, the inventors of the present invention conducted examination. As a result, they obtained knowledge that for appropriately discharging a photocurable composition in the form of micro-sized liquid droplets by using an inkjet, the surface tension of the photocurable composition is important. Furthermore, they obtained knowledge that in order to provide a resist having excellent release properties while controlling the surface tension within a predetermined range, it is important for the photocurable composition to contain a fluorine-containing material in an amount of equal to or greater than a certain level. In addition, the inventors obtained knowledge that if the photocurable composition contains a large amount of solvent having a low boiling point that easily volatilizes in a discharge step, it is difficult to achieve excellent pattern formability while controlling the surface tension within a predetermined range. The present invention was made based on the aforementioned knowledge and solved the aforementioned problems specifically by the following means described in <1>, preferably, the following means described in <2> to <10>.

<1> An inkjet discharge method including discharging a photocurable composition in the form of liquid droplets having a size of equal to or less than 6 pL, in which the composition satisfies the following (a) to (c),
(a) containing a fluorine-containing material in a proportion of equal to or greater than 4% by mass of the composition;
(b) having a surface tension of 25 mN/m to 35 mN/m; and
(c) containing a solvent having a boiling point of equal to or less than 200° C. in an amount of equal to or less than 5% by mass of the composition.

<2> The inkjet discharge method described in <1>, in which the photocurable composition is a composition for imprinting.

<3> The inkjet discharge method described in <1> or <2>, in which the fluorine-containing material has a branched fluorocarbon structure.

<4> The inkjet discharge method described in any one of <1> to <3>, in which the fluorine-containing material is a compound having a structure represented by the following Formula (I) or (II).

$$Rf—X-(AO)_n—R \quad (I)$$

$$Rf—X-(AO)_n—X—Rf \quad (II)$$

(In the formula, each Rf represents a group having a branched fluorocarbon structure; X represents a group, which is selected from an alkylene group having 1 to 10 carbon atoms, an arylene group having 6 to 10 carbon atoms, an ester bond, an amide bond, a sulfonic acid ester bond, a sulfonamide bond, and an ether bond, or a group which is obtained by combining two or more of these; A represents an alkylene group; n represents an integer of equal to or greater than 2; and R represents a hydrogen atom, an acrylate group, or a methacrylate group.)

<5> The inkjet discharge method described in <4>, in which Rf represents a branched perfluoroalkyl group or a branched perfluoroalkenyl group.

<6> The inkjet discharge method described in any one of <1> to <5>, in which the photocurable composition has a viscosity of equal to or less than 20 mPa·s at 25° C.

<7> The inkjet discharge method described in any one of <1> to <6>, in which the amount of a polymerizable monomer contained in the photocurable composition is equal to or greater than 70% by mass of the composition, and the amount of a component having a molecular weight of greater than 2,000 mixed in the composition is equal to or less than 3% by mass of the composition.

<8> The inkjet discharge method described in any one of <1> to <6>, in which the amount of an ethylenically unsaturated unsaturated bond-containing polymerizable monomer contained in the photocurable composition is equal to or greater than 70% by mass of the composition, and the amount of a component having a molecular weight of greater than 2,000 mixed in the composition is equal to or less than 3% by mass of the composition.

<9> A pattern formation method including discharging a photocurable composition onto a substrate or a mold by the discharge method described in any one of <1> to <8>, and irradiating the photocurable composition with light in a state in which the composition is interposed between the mold and the substrate.

<10> A pattern obtained by the pattern formation method described in <9>.

According to the present invention, even when a head for discharging microdroplets having a size of equal to or less than 6 pL that is necessary for controlling a residual film (forming a thin film and achieving uniformity) is used, a photocurable composition can be appropriately discharged. Furthermore, it is possible to provide a discharge method which makes it possible to obtain a pattern having excellent release properties and pattern formability.

DESCRIPTION OF THE PREFERRED EMBODIMENTS

In the present specification, "(meth)acrylate" represents acrylate and methacrylate, "(meth)acryl" represents acryl and methacryl, and "(meth)acryloyl" represents acryloyl and methacryloyl. Furthermore, in the present specification, a "monomeric substance" has the same definition as a "monomer". In the present invention, the monomer refers to a compound which is distinguished from an oligomer and a polymer and has a weight average molecular weight of equal to or less than 2,000.

The "imprinting" mentioned in the present invention preferably refers to the transfer of a pattern having a size of 1 nm to 10 mm, and more preferably refers to the transfer of a pattern (nanoimprinting) having a size of about 10 nm to 100 μm. In the present specification, in a case of a group (atomic group) which has no description regarding whether it is substituted or unsubstituted, the group includes both the group having no substituent and the group having a substituent. For example, an "alkyl group" includes not only an alkyl group having no substituent (unsubstituted alkyl group) but also an alkyl group having a substituent (substituted alkyl group).

Unless otherwise specified, the viscosity mentioned in the present invention is a viscosity at a temperature of 25° C.

The inkjet discharge method of the present invention includes discharging a photocurable composition in the form of liquid droplets having a size of equal to or less than 6 pL, in which the composition satisfies the following (a) to (c).
(a) containing a fluorine-containing material in a proportion of equal to or greater than 4% by mass of the composition;
(b) having a surface tension of 25 mN/m to 35 mN/m;
(c) containing a solvent having a boiling point of equal to or less than 200° C. in an amount of equal to or less than 5% by mass of the composition If the inkjet discharge method is constituted as described above, even when a head for discharging microdroplets having a size of equal to or less than 6 pL that is necessary for controlling a residual film (forming a thin film and achieving uniformity) is used, the photocurable composition can be appropriately discharged. A layer formed of the photocurable composition discharged by using the discharge method is preferably used for forming a pattern by an imprinting method, and the pattern obtained by such a pattern formation method has excellent release properties. Furthermore, the obtained pattern has excellent pattern formability.

[Discharge]
In the present invention, the photocurable composition satisfying predetermined conditions is discharged in the form of liquid droplets having a size of equal to or less than 6 pL. With a known inkjet discharge device, by adjusting the nozzle size, the composition can also be discharged in the form of droplets having a size of equal to or less than 6 pL. However, if the composition becomes micro-sized liquid droplets having a size of equal to or less than 6 pL, it is difficult to uniformly discharge the composition to a substrate in some cases. That is, in the inkjet discharge, as long as the liquid droplets are dropped in the same form onto the substrate consistently in a direction perpendicular to the substrate surface, a clean layer can be formed. However, in reality, because the liquid droplets clog the nozzle, or the wettability with the nozzle surface is not optimized, the accuracy of the discharge position deteriorates with the passage of time, or the liquid droplets are not discharged, and as a result, it is difficult to form a uniform film is phenomenon becomes serious particularly in a thin film (for example, a thin film having a thickness of about 1 nm to 20 nm). The inventors of the present invention solved the problem by controlling the surface tension of the used photocurable composition within a predetermined range.

Although the liquid droplets have a size of equal to or less than 6 pL, the effects of the present invention are markedly exerted when the size is equal to or less than 5 pL, and particularly markedly exerted when the size is 0.5 pL to 3 pL. The discharge temperature is not particularly limited, but is generally set to be room temperature (for example, 20° C. to 35° C.).

Regarding the details of the inkjet device, the description in paragraphs "0033" to "0038" of JP2012-031389A (corresponding to US2012/004385A) can be referred to, and the content of which is incorporated in the specification of the present application. As a commercially available product, an inkjet printer DMP-2831 manufactured by FUJIFILM Dimatix, Inc. can be used.

<Photocurable Composition>

The photocurable composition used in the present invention satisfies the conditions (a) containing a fluorine-containing material in a proportion of equal to or greater than 4% by mass of the composition, (b) having a surface tension of 25 mN/m to 35 mN/m, and (c) containing a solvent having a boiling point of equal to or less than 200° C. in an amount of equal to or less than 5% by mass of the composition.

The fluorine-containing material in the condition (a) is not particularly limited as long as it does not depart from the gist of the present invention. However, it is preferably a fluorine-containing material having a branched fluorocarbon structure. The branched fluorocarbon structure is preferably a branched alkyl fluoride group, more preferably a branched perfluoroalkyl group, and even more preferably a branched perfluoroalkyl group having 3 to 10 carbon atoms. If such a branched fluorocarbon structure is adopted, it is possible to inhibit the fluorine-containing material from forming a close-packed arrangement on the surface of the photocurable composition and to effectively reduce the surface tension of the photocurable composition. Furthermore, if the number of carbon atoms constituting the branched fluorocarbon structure is set to be equal to or less than 10, the compatibility with other components (for example, a polymerizable monomer) which may be mixed in the photocurable composition tends to be improved, and the release properties tend to be further improved.

The fluorine-containing material is preferably a compound having a structure represented by the following Formula (I) or (II).

Rf—X-(AO)$_n$—R    (I)

Rf—X-(AO)$_n$—X—Rf    (II)

(In the formula, each Rf represents a group having a branched fluorocarbon structure; X represents a group, which is selected from an alkylene group having 1 to 10 carbon atoms, an arylene group having 6 to 10 carbon atoms, an ester bond, an amide bond, a sulfonic acid ester bond, a sulfonamide bond, and an ether bond, or a group obtained by combining two or more of these; A represents an alkylene group; n represents an integer of equal to or greater than 2; and R represents a hydrogen atom, an acrylate group, or a methacrylate group.)

Rf is preferably a branched perfluoroalkyl group or a branched perfluoroalkenyl group. The number of carbon atoms constituting Rf is preferably 3 to 10, and more preferably 4 to 8. If the number of carbon atoms is set to be equal to or less than 10, the compatibility with other components (for example, a polymerizable monomer) which may be mixed in the photocurable composition tends to be improved, and the release properties tend to be further improved.

X is preferably an alkylene group having 1 to 10 carbon atoms or a group which is a combination of an alkylene group having 1 to 10 carbon atoms and an ether bond. The alkylene group and the arylene group may have a substituent, but it is preferable for them not to have a substituent.

n is preferably 3 to 40, and more preferably 5 to 25.

R is preferably an acrylate group or an methacrylate group.

In the present invention, the compound represented by Formula (II) is more preferable.

The molecular weight of the fluorine-containing material used in the present invention is preferably 100 to 3,000, and more preferably 500 to 2,000.

The fluorine content of the fluorine-containing material used in the present invention that is defined by the following equation is preferably 5% to 50%, and more preferably 10% to 30%. If the fluorine content is within the above range, the effects of the present invention can be more markedly exerted.

Fluorine content=[(number of fluorine atoms in a compound)×(atomic weight of the fluorine atoms)]/molecular weight of the compound×100

Examples of the fluorine-containing material used in the present invention will be shown below, but the present invention is not limited thereto.

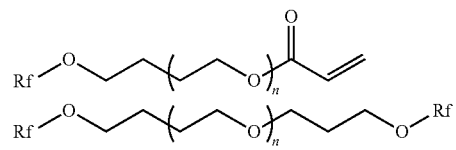

In the formulae, Rf represents the following group, n represents an integer of 5 to 20, and * represents a position where the compound binds to an oxygen atom.

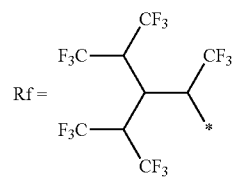

Examples of commercially available products of the fluorine-containing material include Ftergent 251, Ftergent 212M, Ftergent 215M, Ftergent 250, and Ftergent 222F (all manufactured by NEOS COMPANY LIMITED).

The content of the fluorine-containing material used in the present invention is equal to or greater than 4% by mass, preferably 4% by mass to 30% by mass, and more preferably 4% by mass to 15% by mass, with respect to the total amount of the photocurable composition. If the content of the fluorine-containing material is less than 4% by mass, the obtained pattern does not exhibit release properties. If the content of the fluorine-containing material is equal to or less than 30% by mass, it is possible to maintain the surface tension within an appropriate range, improve the inkjet suitability, and control the viscosity of the photocurable composition within a more appropriate range.

The content of the fluorine-containing material can be the sum of the amount of the fluorine-containing material, a polymerizable monomer, a polymerization initiator, a nonpolymerizable compound, an antioxidant, a polymerization initiator, and other materials. The content of the fluorine-containing material is preferably the sum of the amount of the fluorine-containing material, the polymerizable monomer, and the nonpolymerizable compound, more preferably the sum of the amount of the fluorine-containing material and the polymerizable monomer, and even more preferably the amount of the fluorine-containing material alone.

The photocurable composition may contain one kind of the fluorine-containing material or two or more kinds thereof. When the composition contains two or more kinds of fluorine-containing materials, the total amount of the materials is preferably within the aforementioned range.

In the present invention, the surface tension of the photocurable composition in the condition (b) is 25 mN/m to 35 mN/m. If such a constitution is adopted, the wettability with the head nozzle of the inkjet head is optimized. Accordingly, the composition can be discharged in the form of liquid droplets having a size of equal to or less than 6 pL without contaminating the discharge port or causing mist. As means for controlling the surface tension of the composition within a range of 25 mN/m to 35 mN/m, known means can be adopted. However, generally, such a surface tension is achieved by using the fluorine-containing material in the condition (a).

The surface tension of the composition used in the present invention is preferably 26 mN/m to 34 mN/m, and more preferably 27 mN/m to 33 mN/m.

The surface tension in the present invention refers to a surface tension measured by the Wilhelmy method.

In the present invention, the content of the solvent having a boiling point of equal to or less than 200° C. in the condition (c) is equal to or less than 5% by mass of the photocurable composition. A solvent having a low boiling point easily volatilizes in the discharge step and easily contaminates the surrounding environment or the surface of the imprinting mold. Furthermore, if there is a large amount of residual solvent at the time of forming a pattern after discharge, the pattern formability of the obtained pattern deteriorates.

Herein, the solvent means a liquid not having a reactive group (particularly, a polymerizable group).

In the present invention, examples of the solvent having a boiling point of equal to or less than 200° C. include propylene glycol 1-monomethyl ether 2-acetate, methyl ethyl ketone, hexane, ethyl acetate, cyclohexanone, and the like.

In the photocurable composition used in the present invention, the content of the solvent having a boiling point of equal to or less than 200° C. is preferably equal to or less than 3% by mass of the composition, and more preferably equal to or less than 1% by mass of the composition. Particularly, a case in which the photocurable composition substantially does not contain the solvent, that is, a case in which the content of the solvent is 0% by mass, is preferable. If the amount of the solvent, which has a boiling point of equal to or less than 200° C., mixed in the composition is within the aforementioned range, the liquid droplets can be appropriately discharged, and the pattern formability of the obtained pattern can be further improved.

Furthermore, in the photocurable composition used in the present invention, the content of a solvent having a boiling point of greater than 200° C. is preferably equal to or less than 5% by mass of the composition, more preferably equal to or less than 3% by mass of the composition, and even more preferably equal to or less than 1% by mass of the composition. Particularly, a case in which the composition substantially does not contain the solvent, that is, a case in which the content of the solvent is 0% by mass, is preferable. If the amount of the solvent, which has a boiling point of greater than 200° C., mixed in the composition is within the aforementioned range, the amount of the residual solvent after coating can be reduced, and the pattern formability can be further improved.

The photocurable composition used in the present invention preferably has a viscosity of equal to or less than 20 mPa·s, and more preferably has a viscosity of 5 mPa·s to 15 mPa·s, at a temperature of 25° C. If the viscosity is within the aforementioned range, the photocurable composition used in the present invention tends to be easily put into a mold, and the pattern formability tends to be further improved.

The photocurable composition used in the present invention is preferably a composition for imprinting. That is, the discharge method of the present invention is preferably used for discharging liquid droplets of the composition for imprinting for forming a pattern by imprinting. Therefore, the composition used in the present invention preferably mixed with other components suited for forming the composition for imprinting. Accordingly, the photocurable composition used in the present invention preferably contains a polymerizable monomer and a photopolymerization initiator, and may further contain other additives. Examples of other additives include one or more kinds of nonpolymerizable compounds having a polyalkylene glycol structure, in which at least one hydroxyl group is present on the terminal thereof or at least one hydroxyl group on the terminal is etherified, and substantially not containing a fluorine atom and a silicon atom, an antioxidant, a polymerization inhibitor, and the like. Furthermore, within a range that does not depart from the gist of the present invention, the photocurable composition may contain a solvent other than those described above, a polymer component, a surfactant other than the aforementioned fluorine-containing material, and the like.

For example, in the photocurable composition used in the present invention, the content of a polymerizable monomer is equal to or greater than 70% by mass of the composition, and the amount of a component having a molecular weight of greater than 2,000 mixed in the composition is equal to or less than 3% by mass of the composition. Preferably, in the photocurable composition, the content of a polymerizable monomer having an ethylenically unsaturated double bond is equal to or greater than 70% by mass of the composition, and the amount of a component having a molecular weight of greater than 2,000 mixed in the composition is equal to or less than 3% by mass of the composition.

Hereinafter, the aforementioned components will be specifically described.

Polymerizable Monomer

The type of the polymerizable monomer used in the photocurable composition used in the present invention is not particularly limited as long as the polymerizable monomer does not depart from the gist of the present invention. Examples of the polymerizable monomer include a polymerizable unsaturated monomer having 1 to 6 ethylenically unsaturated bond-containing groups; an epoxy compound; an oxetane compound; a vinyl ether compound; a styrene derivative; propenyl ether or butenyl ether; and the like. In the present invention, the polymerizable monomer may contain a fluorine atom. However, it is possible to adopt an embodiment in which the polymerizable monomer does not contain a fluorine atom.

The polymerizable unsaturated monomer having 1 to 6 ethylenically unsaturated bond-containing groups (polymerizable unsaturated monomer having 1 to 6 functional groups) will be described.

First, specific examples of the polymerizable unsaturated monomer having one ethylenically unsaturated bond-containing group include methyl (meth)acrylate, ethyl (meth)acrylate, butyl (meth)acrylate, N-vinylpyrrolidinone, 2-acryloyloxyethyl phthalate, 2-acryloyloxy 2-hydroxyethyl phthalate, 2-acryloyloxyethyl hexahydrophthalate, 2-acryloyloxypropyl phthalate, 2-ethyl-2-butyl propanediol acrylate, 2-ethylhexyl(meth)acrylate, 2-ethylhexyl carbitol (meth)acrylate, 2-hydroxybutyl(meth)acrylate, 2-hydroxyethyl(meth)acrylate, 2-hydroxypropyl(meth)acrylate, 4-hydroxybutyl(meth)acrylate, an acrylic acid dimer, benzyl (meth)acrylate, 1- or 2-naphthyl(meth)acrylate, butoxyethyl(meth)acrylate, cetyl(meth)acrylate, ethylene oxide (hereinafter, abbreviated to "EO")-modified cresol (meth)acrylate, dipropylene glycol(meth)acrylate, ethoxylated phenyl(meth)acrylate, isooctyl(meth)acrylate, cyclohexyl(meth)acrylate, isobornyl(meth)acrylate, dicyclopentanyl(meth)acrylate, dicyclopentanyloxyethyl (meth)acrylate, isomyristyryl(meth)acrylate, lauryl(meth)acrylate, methoxydipropylene glycol(meth)acrylate, methoxytripropylene glycol(meth)acrylate, methoxypolyethylene glycol(meth)acrylate, methoxytriethylene glycol (meth)acrylate, neopentyl glycol benzoate(meth)acrylate, nonylphenoxypolyethylene glycol(meth)acrylate, nonylphenoxypolypropylene glycol (meth)acrylate, octyl(meth)acrylate, p-cumylphenoxyethylene glycol(meth)acrylate, epichlorohydrin (hereinafter, abbreviated to "ECH")-modified phenoxyacrylate, phenoxyethyl(meth)acrylate, phenoxydiethylene glycol(meth)acrylate, phenoxyhexaethylene glycol(meth)acrylate, phenoxytetraethylene glycol(meth)acrylate, polyethylene glycol(meth)acrylate, polyethylene glycol-polypropylene glycol(meth)acrylate, polypropylene glycol(meth)acrylate, stearyl(meth)acrylate, EO-modified succinic acid (meth)acrylate, tribromophenyl(meth)acrylate, EO-modified tribromophenyl(meth)acrylate, tridodecyl (meth)acrylate, p-isopropenylphenol, N-vinylpyrrolidone, and N-vinylcaprolactam.

From the viewpoint of photocuring properties, it is preferable to use a monofunctional (meth)acrylate compound in the present invention, among the aforementioned monofunctional polymerizable monomers having an ethylenically unsaturated bond. Examples of the monofunctional (meth)acrylate compound include monofunctional (meth)acrylate compounds among the monofunctional polymerizable monomers containing an ethylenically unsaturated bond exemplified above.

In the present invention, as the polymerizable monomer, a polyfunctional polymerizable unsaturated monomer having two or more ethylenically unsaturated bond-containing groups is also preferably used.

Examples of bifunctional polymerizable unsaturated monomers having two ethylenically unsaturated bond-containing groups that can be preferably used in the present invention include diethylene glycol monoethyl ether(meth)acrylate, dimethylol dicyclopentane di(meth)acrylate, di(meth)acrylated isocyanurate, 1,3-butylene glycol di(meth)acrylate, 1,4-butanediol di(meth)acrylate, 1,6-hexanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propylene oxide (hereinafter, abbreviated to "PO")-modified neopentyl glycol diacrylate, caprolactone-modified hydroxypivalic acid ester neopentyl glycol, stearic acid-modified pentaerythritol di(meth)acrylate, ECH-modified phthalic acid di(meth)acrylate, poly(ethylene glycol-tetramethylene glycol)di(meth)acrylate, poly(propylene glycol-tetramethylene glycol)di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinyl ethylene urea, divinyl propylene urea, o-, m-, or p-xylylene di(meth)acrylate, 1,3-adamantane diacrylate, norbornane dimethanol di(meth)acrylate, and tricyclodecane dimethanol di(meth)acrylate.

Among these, bifunctional (meth)acrylate, such as neopentyl glycol di(meth)acrylate, 1,9-nonanediol di(meth)acrylate, tripropylene glycol di(meth)acrylate, tetraethylene glycol di(meth)acrylate, hydroxypivalic acid neopentyl glycol di(meth)acrylate, polyethylene glycol di(meth)acrylate, o-, m-, or p-benzene di(meth)acrylate, or o-, m-, or p-xylylene di(meth)acrylate, is particularly preferably used in the present invention.

Examples of polyfunctional polymerizable unsaturated monomers having three or more ethylenically unsaturated bond-containing groups include ECH-modified glycerol tri (meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritol hexa(meth)acrylate, caprolactone-modified dipentaerythritol hexa(meth)acrylate, dipentaerythritol hydroxypenta(met)acrylate, alkyl-modified dipentaerythritol penta(meth)acrylate, dipentaerythritol poly(meth)acrylate, alkyl-modified dipentaerythritol tri (meth)acrylate, ditrimethylolpropane tetra(meth)acrylate, pentaerythritolethoxy tetra(meth)acrylate, pentaerythritol tetra(meth)acrylate, and the like.

Among these, functional (meth)acrylate having three or more functional groups, such as EO-modified glycerol tri (meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritolethoxy tetra(meth)acrylate, or pentaerythritol tetra(meth)acrylate, is particularly preferably used in the present invention.

From the viewpoint of the photocuring properties, it is preferable to use the polyfunctional (meth)acrylate in the present invention among the polyfunctional polymerizable unsaturated monomers having two or more ethylenically unsaturated bonds described above. The polyfunctional (meth)acrylate mentioned herein is a generic term for the bifunctional (meth)acrylate and the functional (meth)acrylate having three or more functional groups. Specific examples of the polyfunctional (meth)acrylate include various polyfunctional (meth)acrylates among the polyfunctional polymerizable unsaturated monomers having two ethylenically unsaturated bonds exemplified above and among the polyfunctional polymerizable unsaturated monomers having three or more ethylenically unsaturated bonds exemplified above.

Examples of the compound (epoxy compound) having an oxirane ring include polyglycidyl esters of polybasic acid, polyglycidyl ethers of polyol, polyglycidyl ethers of polyoxyalkylene glycol, polyglycidyl ethers of aromatic polyol, hydrogenated compounds of polyglycidyl ethers of aromatic polyol, urethane polyepoxy compounds, epoxylated polybutadienes, and the like. One kind of these compounds can be used singly, or two or more kinds thereof can be used by being mixed together.

Examples of the compound (epoxy compound) having an oxirane ring that can be preferably used in the present invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers; polyglycidyl ethers of polyether polyol obtained by adding one kind or two or more kinds of alkylene oxide to an aliphatic polyol such as ethylene glycol, propylene glycol, or glycerin; diglycidyl esters of aliphatic long-chain dibasic acid; monoglycidyl ethers of aliphatic higher alcohol; monoglycidyl ethers of phenol, cresol, butylphenol, or polyether alcohol which is obtained by adding alkylene oxide to the aforementioned alcohols; glycidyl esters of higher fatty acid; and the like.

Among these, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether are preferable.

Examples of commercially available products which can be preferably used as the glycidyl group-containing compound include UVR-6216 (manufactured by Union Carbide Corporation), Glycidol, AOEX 24, Cyclomer A200 (all manufactured by DAICEL CORPORATION), Epikote 828, Epikote 812, Epikote 1031, Epikote 872, Epikote CT508 (all manufactured by Yuka-Shell Epoxy Co., Ltd.), KRM-2400, KRM-2410, KRM-2408, KRM-2490, KRM-2720, KRM-2750 (all manufactured by Asahi Denka Kogyo k. k.), and the like. One kind of these can be used singly, or two or more kinds thereof can be used in combination.

These compounds having an oxirane ring can be prepared by any method. For example, the compounds can be synthesized with reference to documents such as "Experimental Chemistry Course, $4^{th}$ Edition", 20, Organic synthesis II, pp 213~, Maruzen K.K., 1992, "The chemistry of heterocyclic compounds-Small Ring Heterocycles, part 3 Oxiranes" Ed. by Alfred Hasfner, John & Wiley and Sons, An Interscience Publication, New York, 1985, "Adhesion", Yoshimura, vol. 29, No. 12, p. 32, 1985, "Adhesion", Yoshimura, vol. 30, No. 5, p. 42, 1986, "Adhesion", Yoshimura, vol. 30, No. 7, p. 42, 1986, JP1999-100378A (JP-H11-100378A), JP2906245B, and JP2926262B.

As the polymerizable monomer which can be used in the present invention, a vinyl ether compound can also be preferably used. The vinyl ether compound can be appropriately selected from known compounds, and examples thereof include 2-ethylhexyl vinyl ether, butanediol-1,4-divinyl ether, diethylene glycol monovinyl ether, ethylene glycol divnyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethyloletane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, and the like.

These vinyl ether compounds can be synthesized by, for example, the method described in "Polymers Paint Colour Journal", Stephen. C. Lapin, 179 (4237), 321 (1988), that is, by a reaction between a polyol or a polyphenol and acetylene or by a reaction between a polyol or a polyphenol and halogenated alkyl vinyl ether. One kind of the vinyl ether compound can be used singly, or two or more kinds thereof can be used in combination.

As the polymerizable monomer which can be used in the present invention, a styrene derivative can also be adopted. Examples of the styrene derivative include styrene, p-methylstyrene, p-methoxystyrene, β-methylstyrene, p-methyl-β-methylstyrene, α-methylstyrene, p-methoxy-β-methylstyrene, p-hydroxystyrene, and the like.

As the polymerizable monomer which can be used in the present invention, a polymerizable monomer having an alicyclic hydrocarbon structure or an aromatic group is preferable. If the polymerizable monomer having an alicyclic hydrocarbon structure or an aromatic group is used, when the photocurable composition is used as an etching resist for processing a substrate, the line-edge roughness becomes excellent. Particularly, if the polyfunctional polymerizable monomer has an alicyclic hydrocarbon structure or an aromatic group, such an effect becomes marked.

As the polymerizable monomer having an alicyclic hydrocarbon structure, a compound represented by the following Formula (X) is preferable.

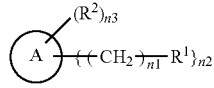

Formula (X)

(In Formula (X), A represents a monocyclic or ring-fused alicyclic hydrocarbon group; $R^1$ represents a polymerizable group; $R^2$ represents a substituent; n1 represents an integer of 1 to 3; n2 represents an integer of 1 to 6; n3 represents an integer of 0 to 5; and here, when n2 is 1, at least one of the groups represented by $R^2$ is a polymerizable group.)

A represents a monocyclic or ring-fused alicyclic hydrocarbon group. A is preferably an alicyclic hydrocarbon group composed of a ring having 3 to 30 carbon atoms, and more preferably an alicyclic hydrocarbon group composed of a ring having 5 to 20 carbon atoms.

A is preferably a monocyclic group or a group composed of two or three fused rings. A is preferably a 5-membered ring, a 6-membered ring, or a fused ring of 5-membered rings or 6-membered rings. A is more preferably cyclohexane, norbornane, or tricyclodecane, and even more preferably tricyclodecane.

$R^1$ is preferably a (meth)acryloyloxy group, and more preferably an acryloyloxy group.

$R^2$ is a substituent. $R^2$ is preferably a polymerizable group or an alkyl group, more preferably a (meth)acryloyloxy group or a methyl group, and particularly preferably an acryloyloxy group.

n1 represents an integer of 1 to 3. n1 is more preferably 1 or 2.

n2 represents an integer of 1 to 6. n2 is preferably an integer of 2 to 6, more preferably an integer of 2 to 4, even more preferably 2 or 3, and particularly preferably 2.

n3 represents an integer of 0 to 5. n3 is preferably an integer of 0 to 3, and more preferably 0.

Examples of the compound represented by Formula (X) will be shown below, but it goes without saying that the present invention is not limited thereto.

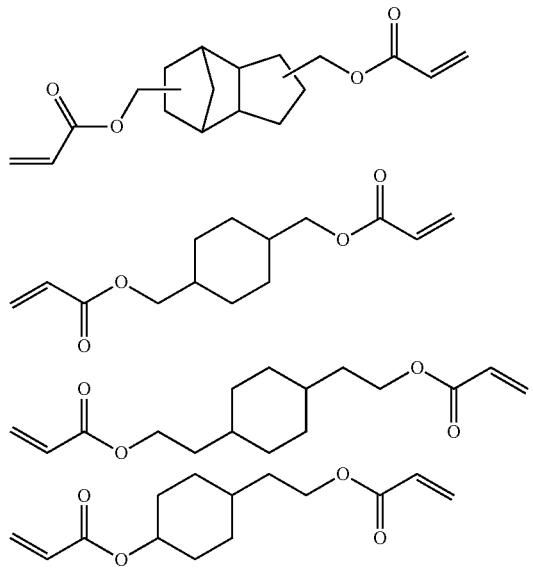

-continued

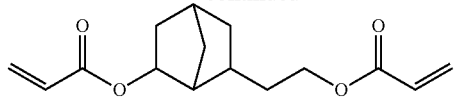

As the polymerizable monomer having an alicyclic hydrocarbon structure, in addition to the aforementioned monomers, monofunctional (meth)acrylate having an alicyclic hydrocarbon structure, such as isobornyl(meth)acrylate, dicyclopentanyl(meth)acrylate, dicyclopentanyloxyethyl (meth)acrylate, dicyclopentenyl(meth)acrylate, adamantyl (meth)acrylate, tricyclodecanyl(meth)acrylate, and tetracyclododecanyl(meth)acrylate, and polyfunctional (meth) acrylate having an alicyclic hydrocarbon structure, such as tricyclodecane dimethanol di(meth)acrylate and 1,3-adamantanediol di(meth)acrylate, are preferable.

The polymerizable monomer having an aromatic group that is usable in the present invention is preferably a monfunctional (meth)acrylate compound represented by the following Formula (I) or a polyfunctional (meth)acrylate compound represented by Formula (II) which will be described later.

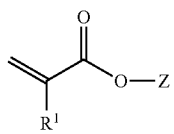

(I)

(In the formula, Z represents a group containing an aromatic group, and $R^1$ represents a hydrogen atom, an alkyl group, or a halogen atom.)

$R^1$ is preferably a hydrogen atom or an alkyl group, and more preferably a hydrogen atom or a methyl group. From the viewpoint of curing properties, $R^1$ is even more preferably a hydrogen atom. Examples of the halogen atom include a fluorine atom, a chlorine atom, a bromine atom, and an iodine atom, and among these, a fluorine atom is preferable.

Z is preferably an alkyl group which may have a substituent, an aryl group which may have a substituent, or a group formed by bonding of these groups through a linking group. The linking group mentioned herein may include a linking group containing a heteroatom. As the linking group, —$CH_2$—, —O—, —C(=O)—, —S—, and a group which is a combination of these are preferable. As the aromatic group contained in Z, a phenyl group and a naphthyl group are preferable. The molecular weight of Z is preferably 90 to 300, and more preferably 120 to 250.

When the polymerizable monomer represented by Formula (I) is a liquid at a temperature of 25° C., the viscosity thereof at a temperature of 25° C. is preferably 2 mPa·s to 500 mPa·s, more preferably 3 mPa·s to 200 mPa·s, and most preferably 3 mPa·s to 100 mPa·s. The polymerizable monomer is preferably a liquid at a temperature of 25° C. Even when the polymerizable monomer is a solid at a temperature of 25° C., the melting point thereof is preferably equal to or less than 60° C., and more preferably equal to or less than 40° C. The polymerizable monomer is even more preferably a liquid at a temperature of 25° C.

Z is preferably a group represented by —$Z^1$—$Z^2$. $Z^1$ is a single bond or a hydrocarbon group. The hydrocarbon group may contain a heteroatom-containing linking group in the chain thereof. $Z^2$ is an aromatic group which may have a substituent and has a molecular weight of equal to or greater than 90.

$Z^1$ is preferably a single bond or an alkylene group. The alkylene group may contain a heteroatom-containing linking group in the chain thereof. $Z^1$ is more preferably an alkylene group which does not contain a heteroatom-containing linking group in the chain thereof, and more preferably a methylene group or an ethylene group. Examples of the heteroatom-containing linking group include —O—, —C(=O)—, —S—, and a group which is a combination of these and an alkylene group. Furthermore, the hydrocarbon group preferably has 1 to 3 carbon atoms.

$Z^2$ is also preferably a group in which two or more aromatic groups are directly linked to other or linked to each other through a linking group. In this case, as the linking group, —CH$_2$—, —O—, —C(=O)—, —S—, and a group which is a combination of these are preferable.

Examples of the substituent that the aromatic group of the polymerizable monomer represented by Formula (I) may have include a halogen atom (a fluorine atom, a chlorine atom, a bromine atom, or an iodine atom), a linear, branched, or cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, a heterocyclic group, and the like. In addition, groups which are further substituted with these groups are also preferable.

The amount of the polymerizable monomer represented by Formula (I) added to the photocurable composition is preferably 10% by mass to 100% by mass, more preferably 20% by mass to 100% by mass, and particularly preferably 30% by mass to 80% by mass.

Specific examples of compounds, which do not have a substituent on an aromatic ring, among the compounds represented by Formula (I) preferably include benzyl (meth)acrylate, phenethyl(meth)acrylate, phenoxyethyl(meth)acrylate, 1- or 2-naphthyl(meth)acrylate, 1- or 2-naphthylmethyl(meth)acrylate, 1- or 2-naphthylethyl(meth)acrylate, and 1- or 2-naphthoxyethyl(meth)acrylate.

As the compound represented by Formula (I), a compound which is represented by the following Formula (I-1) and has a substituent on an aromatic ring is also preferable.

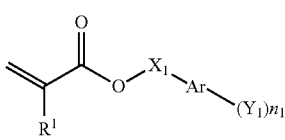

(In Formula (I-1), $R^1$ represents a hydrogen atom, an alkyl group, or a halogen atom; $X^1$ represents a single bond or a hydrocarbon group which may contain a heteroatom-containing linking group in the chain thereof; $Y^1$ represents a substituent having a molecular weight of equal to or greater than 15; n1 represents an integer of 1 to 3; and Ar represents an aromatic linking group which is preferably a phenylene group or a naphthylene group.)

$R^1$ has the same definition as $R^1$ in the formula described above, and the preferred range thereof is also the same.

$X^1$ has the same definition as $Z^1$ described above, and the preferred range thereof is also the same.

$Y^1$ is a substituent having a molecular weight of equal to or greater than 15, and examples thereof include an alkyl group, an alkoxy group, an aryloxy group, an aralkyl group, an acyl group, an alkoxycarbonyl group, an alkylthio group, an arylthio group, a halogen atom, a cyano group, and the like. These substituents may further have a substituent.

When n1 is 2, $X^1$ is preferably a single bond or a hydrocarbon group having one hydrogen atom.

Particularly, an embodiment is preferable in which n1 is 1 and $X^1$ is an alkylene group having 1 to 3 carbon atoms.

The compound represented by Formula (I) is more preferably a compound represented by any of Formulae (I-2) and (I-3)

Compound represented by Formula (I-2)

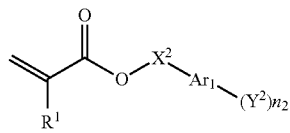

In Formula (I-2), $R^1$ represents a hydrogen atom, an alkyl group, or a halogen atom; $X^2$ is a single bond or a hydrocarbon group which may contain a heteroatom-containing linking group in the chain thereof; $Y^2$ represents a substituent which has a molecular weight of equal to or greater than 15 and does not have an aromatic group; and n2 represents an integer of 1 to 3.

$R^1$ has the same definition as $R^1$ in the formula described above, and the preferred range thereof is also the same.

When $X^2$ is a hydrocarbon group, the hydrocarbon group preferably has 1 to 3 carbon atoms. $X^2$ is preferably a substituted or unsubstituted alkylene group having 1 to 3 carbon atoms, more preferably an unsubstituted alkylene group having 1 to 3 carbon atoms, and even more preferably a methylene group or an ethylene group. If such a hydrocarbon group is adopted, it is possible to obtain a photocurable composition which has lower viscosity and lower volatility.

$Y^2$ represents a substituent which has a molecular weight of equal to or greater than 15 and does not have an aromatic group. The upper limit of the molecular weight of $Y^2$ is preferably equal to or less than 150. Preferred examples of $Y^2$ include an alkyl group having 1 to 6 carbon atoms, such as a methyl group, an ethyl group, an isopropyl group, a tert-butyl group, or a cyclohexyl group, a halogen atom such as a fluoro group, a chloro group, or a bromo group, an alkoxy group having 1 to 6 carbon atoms, such as a methoxy group, an ethoxy group, or a cyclohexyloxy group, and a cyano group.

n2 is preferably an integer of 1 to 2. When n2 is 1, the substituent Y is preferably in the para-position. From the viewpoint of viscosity, when n2 is 2, $X^2$ is preferably a single bond or a hydrocarbon group having one carbon atom.

From the viewpoint of achieving both the low viscosity and the low volatility, the molecular weight of the (meth)acrylate compound represented by Formula (I-2) is preferably 175 to 250, and more preferably 185 to 245.

Furthermore, the (meth)acrylate compound represented by Formula (I-2) preferably has a viscosity of equal to or less than 50 mPa·s, and more preferably has a viscosity of equal to or less than 20 mPa·s, at a temperature of 25° C.

The compound represented by Formula (I-3) can be preferably used as a reactive diluent.

From the viewpoint of the viscosity of the composition and the accuracy of the pattern after curing, the amount of the compound represented by Formula (I-2) added to the photocurable composition is preferably equal to or greater than 10% by mass, more preferably equal to or greater than 15% by mass, and particularly preferably equal to or greater than 20% by mass. In contrast, from the viewpoint of tackiness or dynamic strength after curing, the amount of the compound added to the photocurable composition is preferably equal to or less than 95% by mass, more preferably equal to or less than 90% by mass, and particularly preferably equal to or less than 85% by mass.

Examples of the compound represented by Formula (I-2) will be shown below, but it goes without saying that the present invention is not limited thereto.

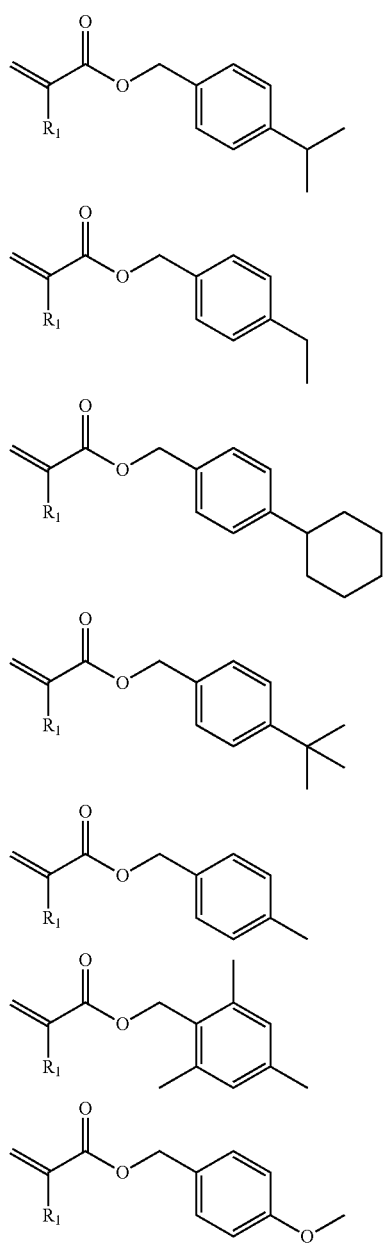

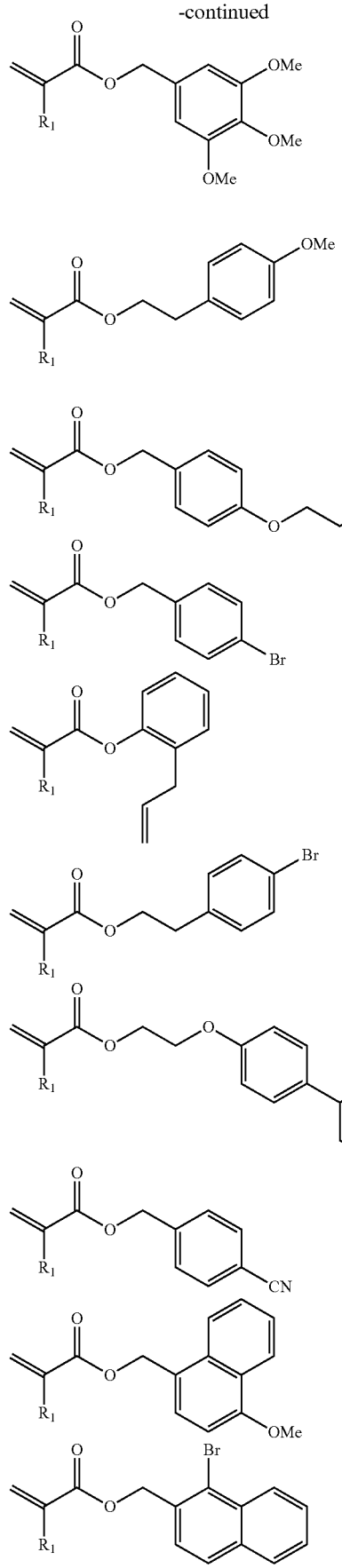

Compound represented by Formula (I-3)

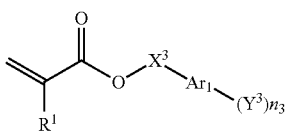

(In Formula (I-3), $R^1$ represents a hydrogen atom, an alkyl group, or a halogen atom; $X^3$ represents a single bond or a hydrocarbon group which may contain a heteroatom-containing linking group in the chain thereof; $Y^3$ represents a substituent having an aromatic group; and n3 represents a an integer of 1 to 3.)

$R^1$ has the same definition as $R^1$ in the formula described above, and the preferred range thereof is also the same.

$Y^3$ represents a substituent having an aromatic group. As the substituent having an aromatic group, an embodiment is preferable in which the aromatic group is bonded to the aromatic ring of Formula (I-3) through a single bond or a linking group. Preferred examples of the linking group include an alkylene group, a heteroatom-containing linking group (preferably —O—, —S—, or —C(=O)O—), and a combination of these. The linking group is more preferably an alkylene group, —O—, or a group which is a combination of these. The substituent having an aromatic group is preferably a substituent having a phenyl group. An embodiment is preferable in which a phenyl group is bonded through a single bond or the aforementioned linking group. The substituent is particularly preferably a phenyl group, a benzyl group, a phenoxy group, a benzyloxy group, or a phenylthio group. The molecular weight of $Y^3$ is preferably 230 to 350.

n3 is preferably 1 or 2, and more preferably 1.

The amount of the compound represented by Formula (I-3) added to the photocurable composition used in the present invention is preferably equal to or greater than 10% by mass, more preferably equal to or greater than 20% by mass, and particularly preferably equal to or greater than 30% by mass. In contrast, from the viewpoint of the tackiness or dynamic strength after curing, the amount of the compound added to the photocurable composition is preferably equal to or less than 90% by mass, more preferably equal to or less than 80% by mass, and particularly preferably equal to or less than 70% by mass.

Examples of the compound represented by Formula (I-3) will be shown below, but it goes without saying that the present invention is not limited thereto.

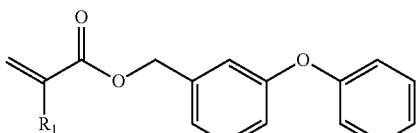

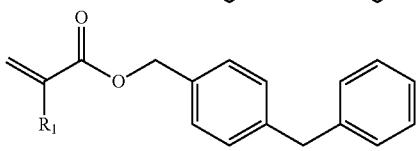

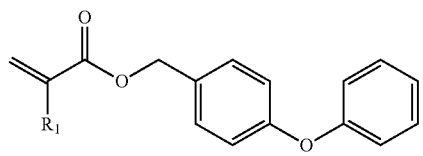

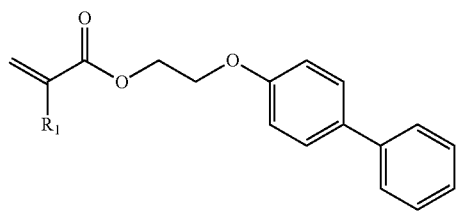

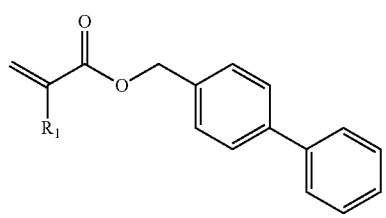

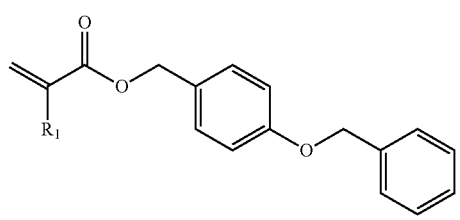

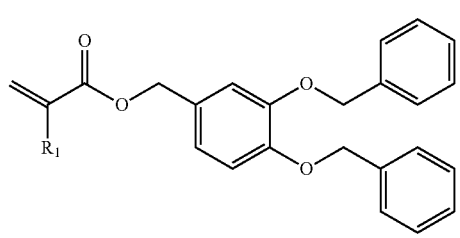

Polyfunctional (meth)acrylate compound represented by Formula (II)

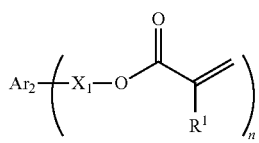

In the formula, $Ar_2$ represents an n-valent linking group having an aromatic group. $Ar_2$ is preferably a linking group having a phenylene group. The definition of $X_1$ and $R^1$ is the same as described above. n represents 1 to 3 and is preferably 1.

The compound represented by Formula (II) is preferably a compound represented by Formula (II-1) or (II-2).

Compound represented by Formula (II-1)

(II-1)

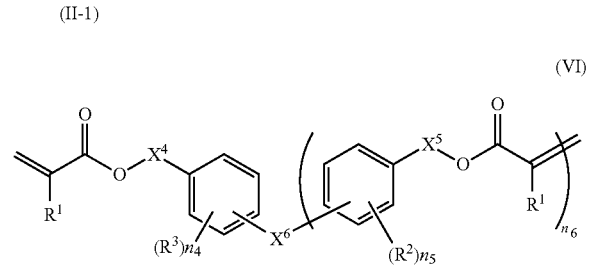

(In Formula (II-1), $X^6$ represents an (n6+1)-valent linking group; each $R^1$ represents a hydrogen atom, an alkyl group, or a halogen atom; each of $R^2$ and $R^3$ is a substituent; each of n4 and n5 is an integer of 0 to 4; n6 is 1 or 2; and each of $X^4$ and $X^5$ is a hydrocarbon group which may contain a heteroatom-containing linking group in the chain thereof.)

$X^6$ represents a single bond or an (n6+1)-valent linking group. As $X^6$, an alkylene group, —O—, —S—, —C(=O)O—, and a linking group obtained by combining a plurality of groups among these. The alkylene group is preferably an alkylene group having 1 to 8 carbon atoms, and more preferably an alkylene group having 1 to 3 carbon atoms. Furthermore, the alkylene group is preferably an unsubstituted alkylene group.

n6 is preferably 1. When n6 is 2, a plurality of groups represented by each of $R^1$, $X^5$, and $R^2$ may be the same as or different from each other.

Each of $X^4$ and $X^5$ is preferably an alkylene group not containing a linking group, more preferably an alkylene group having 1 to 5 carbon atoms, even more preferably an alkylene group having 1 to 3 carbon atoms, and most preferably a methylene group.

$R^1$ has the same definition as $R^1$ in the formula described above, and the preferred range thereof is also the same.

Each of $R^2$ and $R^3$ represents a substituent. The substituent is preferably an alkyl group, a halogen atom, an alkoxy group, an acyl group, an acyloxy group, an alkoxycarbonyl group, a cyano group, or a nitro group. The alkyl group is preferably an alkyl group having 1 to 8 carbon atoms. Examples of the halogen atom include a fluorine atom, a chlorine atom, a bromine atom, and an iodine atom. Among these, a fluorine atom is preferable. The alkoxy group is preferably an alkoxy group having 1 to 8 carbon atoms. The acyl group is preferably an acyl group having 1 to 8 carbon atoms. The acyloxy group is preferably an acyloxy group having 1 to 8 carbon atoms. The alkoxycarbonyl group is preferably an alkoxycarbonyl group having 1 to 8 carbon atoms.

Each of n4 and n5 is an integer of 0 to 4. When n4 or n5 is equal to or greater than 2, a plurality of groups represented by each of $R^2$ and $R^3$ may be the same as or different from each other.

The compound represented by Formula (II-1) is preferably a compound represented by the following Formula (II-1a).

(II-1a)

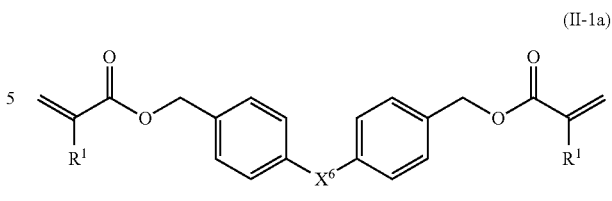

($X^6$ is an alkylene group, —O—, —S—, or a linking group obtained by combining a plurality of groups among these, and each $R^1$ is a hydrogen atom, an alkyl group, or a halogen atom.)

$R^1$ has the same definition as $R^1$ in the formula described above, and the preferred range thereof is also the same.

When $X^6$ is an alkylene group, the alkylene group is preferably an alkylene group having 1 to 8 carbon atoms, and more preferably an alkylene group having 1 to 3 carbon atoms. Furthermore, $X^6$ is preferably an unsubstituted alkylene group.

As $X^6$, —$CH_2$—, —$CH_2CH_2$—, —O—, and —S— are preferable.

The content of the compound represented by Formula (II-1) in the photocurable composition used in the present invention is not particularly limited. However, from the viewpoint of the viscosity of the photocurable composition, the content of the group is preferably 1% by mass to 100% by mass, more preferably 5% by mass to 70% by mass, and particularly preferably 10% by mass to 50% by mass, with respect to the total amount of the polymerizable monomer.

Examples of the compound represented by Formula (II-1) will be shown below, but it goes without saying that the present invention is not limited thereto. In the following Formulae, each $R^1$ has the same definition as $R^1$ in Formula (II-1), and the preferred range thereof is also the same. $R^1$ is particularly preferably a hydrogen atom.

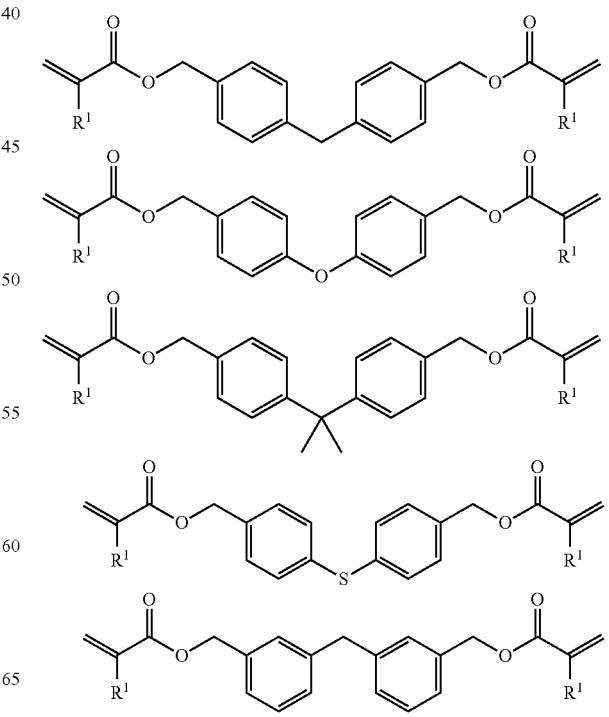

-continued

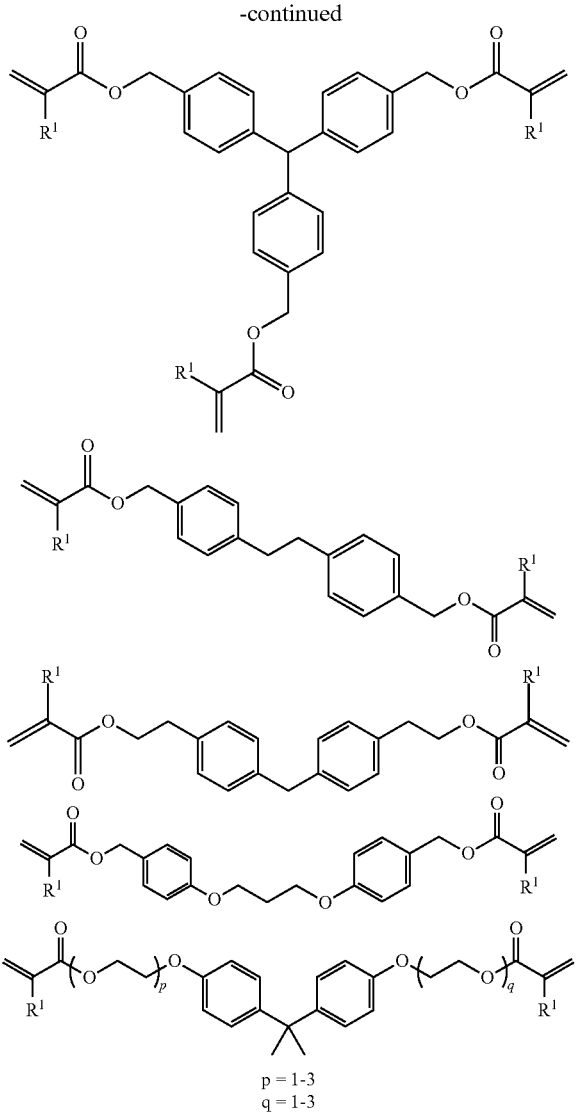

Polymerizable monomer represented by the following Formula (II-2)

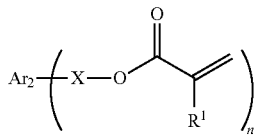

(In the formula, Ar represents an arylene group which may have a substituent; X represents a single bond or an organic linking group; $R^1$ represents a hydrogen atom or a methyl group; and n represents 2 or 3.)

Examples of the arylene group in the above formula include a hydrocarbon-based arylene group such as a phenylene group or a naphthylene group; a heteroarylene group in which indole, carbazole, or the like functions as a linking group; and the like. The arylene group is preferably a hydrocarbon-based arylene group. From the viewpoint of the viscosity and etching resistance, the arylene group is more preferably a phenylene group. The arylene group may have a substituent. Examples of preferred substituents include an alkyl group, an alkoxy group, a hydroxyl group, a cyano group, an alkoxycarbonyl group, an amide group, and a sulfonamide group.

Examples of the organic linking group represented by X include an alkylene group which may contain a heteroatom in the chain thereof, an arylene group, and an aralkylene group. Among these, an alkylene group and an oxyalkylene group are preferable, and an alkylene group is more preferable. X is particularly preferably a single bond or an alkylene group.

$R^1$ is a hydrogen atom or a methyl group, and preferably a hydrogen atom.

n is 2 or 3, and preferably 2.

From the viewpoint of reducing the viscosity of the composition, the polymerizable monomer represented by Formula (II-2) is preferably a polymerizable monomer represented by the following Formula (II-2a) or (II-2b).

Formula (II-2a)

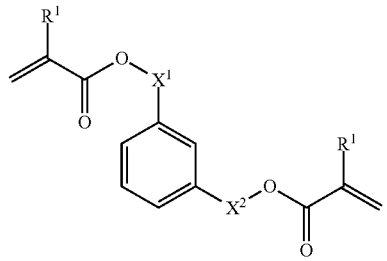

Formula (II-2b)

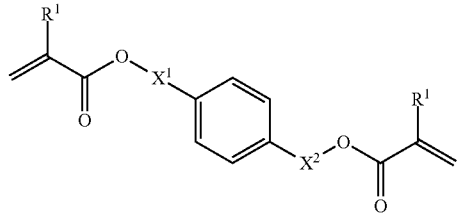

(In the formulae, each of $X^1$ and $X^2$ independently represents a single bond or an alkylene group which has 1 to 3 carbon atoms and may have a substituent, and $R^1$ represents a hydrogen atom or a methyl group.)

In Formula (II-2a), $X^1$ is preferably a single bond or a methylene group. From the viewpoint of reducing the viscosity, $X^1$ is more preferably a methylene group.

The preferred range of $X^2$ is the same as the preferred range of $X^1$.

$R^1$ has the same definition as $R^1$ in the formula described above, and the preferred range thereof is also the same.

It is preferable for the polymerizable monomer to be a liquid at a temperature of 25° C. because the occurrence of foreign substances can be inhibited even when the amount of the polymerizable monomer added is increased.

Specific examples of the polymerizable monomer represented by Formula (II-2) will be shown below. $R^1$ has the same definition as $R^1$ in the formula described above and represents a hydrogen atom or a methyl group. Herein, the present invention is not limited to the following specific examples.

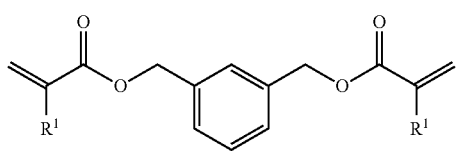
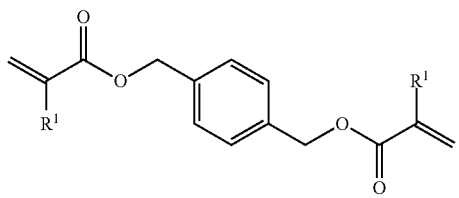
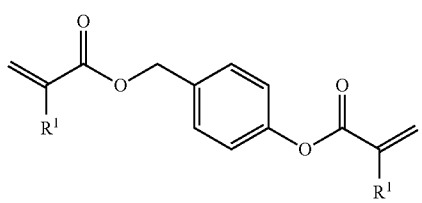
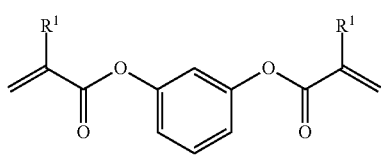
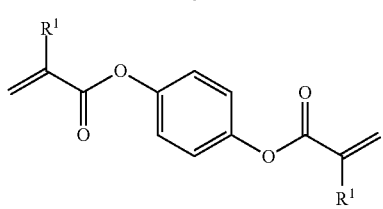
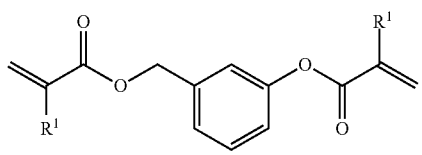
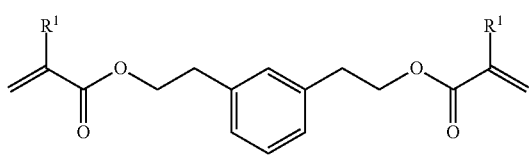
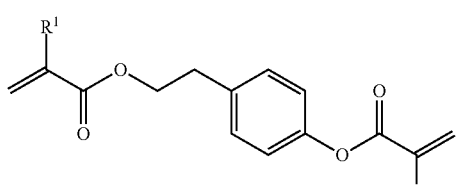
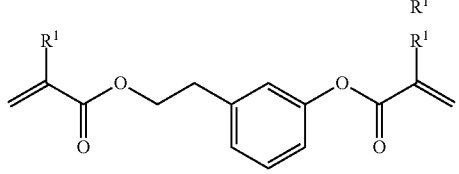
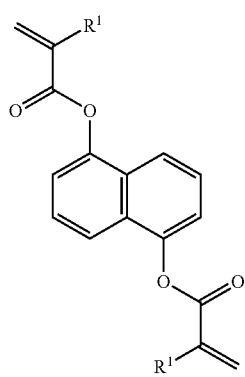
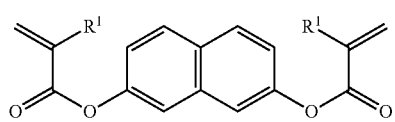
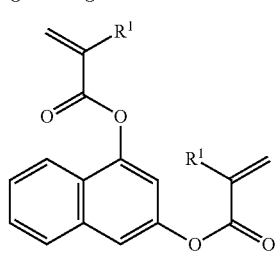
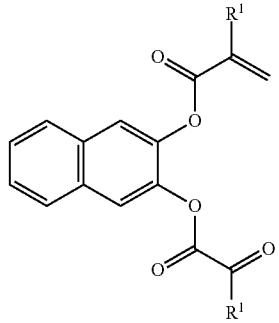
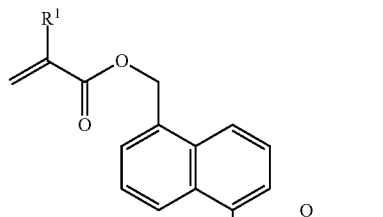
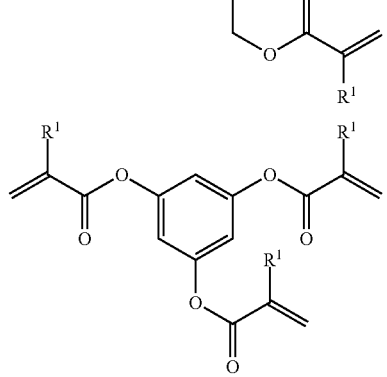

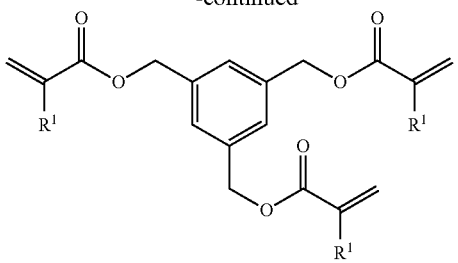

More preferred examples of the polymerizable monomer having an aromatic group used in the photocurable composition used in the present invention will be specifically shown below, but the present invention is not limited thereto.

As the polymerizable monomer having an aromatic group, benzyl (meth)acrylate which has no substituent or has a substituent on an aromatic ring, a phenethyl(meth)acrylate which has no substituent or has a substituent on an aromatic ring, phenoxyethyl(meth)acrylate which has no substituent or has a substituent on an aromatic ring, 1- or 2-naphthyl (meth)acrylate which has no substituent or has a substituent on an aromatic ring, 1- or 2-naphthylmethyl(meth)acrylate which has no substituent or has a substituent on an aromatic ring, 1- or 2-naphthylethyl(meth)acrylate which has no substituent or has a substituent on an aromatic ring, 1- or 2-naphthoxyethyl(meth)acrylate, resorcinol di(meth)acrylate, m-xylylene di(meth)acrylate, naphthalene di(meth) acrylate, and ethoxylated bisphenol A diacrylate are preferable. Among these, benzyl acrylate which has no substituent or has a substituent on an aromatic ring, 1- or 2-naphthylmethyl acrylate, and m-xylylene diacrylate are more preferable.

(A2) Polymerizable Monomer Having Silicon Atom

The photocurable composition used in the present invention preferably contains a polymerizable monomer having a silicon atom as the polymerizable monomer. Examples of such a compound will be shown below.

In the present invention, in order to improve the release properties of the mold, a polymerizable monomer having a silicon atom can be added. In the present invention, the (A2) polymerizable monomer having a silicon atom is a compound having at least one silicon atom-containing group and at least one polymerizable functional group. As the polymerizable functional group, a methacryloyl group, an epoxy group, and a vinyl ether group are preferable.

The (A2) polymerizable monomer having a silicon atom may be a low-molecular weight compound or a polymer.

When the (A2) polymerizable monomer having a silicon atom is a polymer, the polymerizable monomer may have a repeating unit having a silicon atom and a repeating unit having a polymerizable group on a side chain as a copolymerization component. Furthermore, the repeating unit having a silicon atom may have a polymerizable group on the side chain thereof, particularly, on a terminal thereof. In this case, the skeleton of the repeating unit having a silicon atom is not particularly limited unless it is against the gist of the present invention. For example, the repeating unit preferably has a skeleton derived from an ethylenically unsaturated bond-containing group, and more preferably has an embodiment in which the repeating unit has a (meth)acrylate skeleton. In addition, in the repeating unit having a silicon atom, the silicon atom may form the repeating unit just like a siloxane structure (for example, a dimethyl siloxane structure). The weight average molecular weight thereof is preferably 2,000 to 100,000, more preferably 3,000 to 70,000, and particularly preferably 5,000 to 40,000.

Examples of the functional group having a silicon atom that the polymerizable monomer has include a trialkylsilyl group, a chain-like siloxane structure, a cyclic siloxane structure, a cage-like siloxane structure, and the like. From the viewpoint of compatibility with other components and the release properties of the mold, a trimethylsilyl group or a functional group having a dimethylsiloxane structure is preferable.

Specific examples of the polymerizable monomer having a silicon atom include 3-tris(trimethylsilyloxy)silylpropyl (meth)acrylate, trimethylsilylethyl(meth)acrylate, (meth) acryloxymethyl bis(trimethylsiloxy)methylsilane, (meth) acryloxymethyl tris(trimethylsiloxy)silane, 3-(meth) acryloxypropyl bis(trimethylsiloxy)methylsilane, polysiloxane having a (meth)acryloyl group on a terminal or a side chain (for example, an X-22-164 series, X-22-174DX, X-22-2426, or X-22-2475 manufactured by Shin-Etsu Chemical Co., Ltd.), and the like.

The amount of the polymerizable (meth)acrylate monomer containing an aromatic group contained as a polymerizable monomer in the photocurable composition used in the present invention is preferably 70% by mass to 100% by mass, more preferably 90% by mass to 100% by mass, and particularly preferably 95% by mass to 100% by mass, with respect to the total amount of the polymerizable components.

In a particularly preferred embodiment, the amount of the following polymerizable monomer (1) is 0% by mass to 80% by mass (more preferably 20% by mass to 70% by mass) with respect to the total amount of the polymerizable components, the amount of the following polymerizable monomer (2) is 20% by mass to 100% by mass (more preferably 30% by mass to 80% by mass) with respect to the total amount of the polymerizable components, and the amount of the following polymerizable monomer (3) is 0% by mass to 10% by mass (more preferably 0.1% by mass to 6% by mass) with respect to the total amount of the polymerizable components.

(1) A polymerizable monomer having one aromatic group (preferably a phenyl group or a naphthyl group) and one (meth)acryloyloxy group (for example, 2-phenoxyethyl acrylate)

(2) A polymerizable monomer having an aromatic group (preferably a phenyl group or a naphthyl group) and two to four (meth)acrylate groups (for example, the following compound)

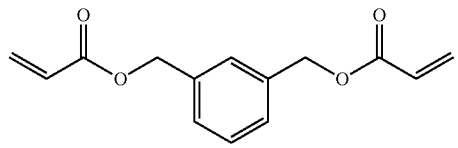 [SMILES: C=CC(=O)OCc1cccc(COC(=O)C=C)c1]

In the photocurable composition, the content of the polymerizable monomer having a viscosity of less than 5 mPa·s at a temperature of 25° C. is preferably equal to or less than 50% by mass, more preferably equal to or less than 30% by mass, and even more preferably equal to or less than 10% by mass, with respect to the total amount of the polymerizable monomers. If the content of the aforementioned monomer is set within the range described above, the stability at the time of performing inkjet discharge is improved, and defects can be reduced at the time of transfer performed by imprinting.

(B) Polymerization Initiator

The photocurable composition used in the present invention contains a photopolymerization initiator. The photopolymerization initiator used in the present invention is not particularly limited as long as it is a compound generating an active species for polymerizing the aforementioned polymerizable monomer by being irradiated with light. The photopolymerization initiator is preferably a radical polymerization initiator or a cationic polymerization initiator, and more preferably a radical polymerization initiator. In the present invention, plural kinds of photopolymerization initiators may be used concurrently.

The content of the photopolymerization initiator used in the present invention is, for example, 0.01% by mass to 15% by mass, preferably 0.1% by mass to 12% by mass, and more preferably 0.2% by mass to 7% by mass, with respect to the total amount of the composition excluding the solvent. When two or more kinds of the photopolymerization initiators are used, the total amount thereof is controlled within the aforementioned range.

It is preferable that the content of the photopolymerization initiator is equal to or greater than 0.01% by mass because the sensitivity (quick-curing properties), resolution, line-edge roughness, and strength of the coating film tend to be improved. Furthermore, it is preferable that the content of the photopolymerization initiator is equal to or less than 15% by mass because the light-transmitting properties, colorability, handleability, and the like tend to be improved.

As the radical photopolymerization initiator used in the present invention, for example, commercially available initiators can be used. For instance, those described in paragraph "0091" of JP2008-105414A can be preferably adopted. Among those compounds, from the viewpoint of the curing sensitivity and absorption characteristics, an acetophenone-based compound, a phenylglyoxylate-based compound, an acylphosphine oxide-based compound, and an oxime ester-based compound are preferable.

Preferred examples of the acetophenone-based compound include a hydroxyacetophenone-based compound, a dialkoxyacetophenone-based compound, and an aminoacetophenone-based compound. Preferred examples of the hydroxyacetophenone-based compound include Irgacure (registered trademark) 2959 (1-[4-(2-hydroxyethoxy)phenyl]-2-hydroxy-2-methyl-1-propan-1-one), Irgacure (registered trademark) 184 (1-hydroxycyclohexylphenyl ketone), Irgacure (registered trademark) 500 (1-hydroxycyclohexyl-phenyl ketone, benzophenone), and Darocure (registered trademark) 1173 (2-hydroxy-2-methyl-1-phenyl-1-propan-1-one) available from BASF Corporation.

Preferred examples of the dialkoxyacetophenone-based compound include Irgacure (registered trademark) 651 (2,2-dimethoxy-1,2-diphenylethan-1-one) available from BASF Corporation.

Preferred examples of the aminoacetophenone-based compound include Irgacure (registered trademark) 369 (2-benzyl-2-dimethylamino-1-(4-morpholinophenyl)butanone-1), Irgacure (registered trademark) 379 (EG) (2-dimethylamino-2-(4 methylbenzyl)-1-(4-morpholin-4-ylphenyl)butan-1-one, and Irgacure (registered trademark) 907 (2-methyl-1-[4-(methylthio)phenyl]-2-(4-morpholinyl)-1-propanone) available from BASF Corporation.

Preferred examples of the phenylglyoxylate-based compound include Irgacure (registered trademark) 754 and Darocure (registered trademark) MBF available from BASF Corporation.

Preferred examples of the acylphosphine oxide-based compound include Irgacure (registered trademark) 819 (bis(2,4,6-trimethylbenzoyl)-phenylphosphine oxide), Irgacure (registered trademark) 1800 (bis(2,6-dimethoxybenzoyl)-2,4,4-trimethyl-pentylphosphine oxide), Lucirin TPO (2,4,6-trimethylbenzoyl diphenylphosphine oxide), and Lucirin TPO-L (2,4,6-trimethylbenzoyl phenylethoxyphoephine oxide) available from BASF Corporation.

Examples of commercially available products of the oxime ester-based compound include Irgacure OXE-01, Irgacure 379, Irgacure 369, Irgacure 754, Irgacure OXE-02, Irgacure 1800, Irgacure 651, Irgacure 907, Lucirin TPO, Darocure 1173 (all manufactured by BASF Corporation), and the like.

As the cationic photopolymerization initiator used in the present invention, a sulfonium salt compound, an iodonium salt compound, an oxime sulfonate compound, and the like are preferable. Examples thereof include 4-methylphenyl 4-(1-methylethyl)phenyl-iodonium tetrakis(pentafluorophenyl)borate (PI 2074 manufactured by Rhodia S. A.), 4-methylphenyl-4-(2-methylpropyl)phenyl iodonium hexafluorophosphate (IRGACURE 250 manufactured by BASF Corporation), IRGACURE PAG103, 108, 121, 203 (manufactured by Ciba Specialty Chemicals, Inc.), and the like.

In the present invention, "light" includes not only the light having a wavelength in a region of ultraviolet light, near-infrared light, far-infrared light, visible light, infrared light, and the like but also electromagnetic waves and radiation. The radiation includes, for example, microwaves, electron beams, EUV, and X-rays. Furthermore, it is possible to use laser light such as a 248 nm excimer laser, a 193 nm excimer laser, and a 172 nm excimer laser. These lights may be used in the form of monochromatic light (single-wavelength light) passing through an optical filter or in the form of light (complex light) having a plurality of different wavelengths. As an exposure method, multiple exposure can be adopted. Alternatively, in order to improve the film strength and etching resistance, flood exposure can be performed after a pattern is formed.

(C) Nonpolymerizable Compound

In the present invention, the photocurable composition contains a nonpolymerizable compound having a polyalkylene glycol structure, in which at least one hydroxyl group is present on a terminal thereof or the hydroxyl group is etherified, and substantially not containing a fluorine atom and a silicon atom.

Herein, the nonpolymerizable compound refers to a compound not having a polymerizable group.

As the polyalkylene glycol structure that the (C) polymerizable compound used in the present invention has, a polyalkylene glycol structure containing an alkylene group having 1 to 6 carbon atoms is preferable; a polyethylene glycol structure, a polypropylene structure, a polybutylene glycol structure, or a structure as a mixture of these is more preferable; a polyethylene glycol structure, a polypropylene glycol structure, or a structure as a mixture of these is even more preferable; and a polypropylene glycol structure is particularly preferable.

Furthermore, it is preferable that the nonpolymerizable compound is substantially constituted only with a polyalkylene glycol structure except for the substituent on the terminal. Herein, the term "substantially" means that the amount of constituents other than the polyalkylene glycol structure is equal to or less than 5% by mass, and preferably equal to or less than 1% by mass, with respect to the total amount of the compound. In the present invention, it is particularly preferable that the photocurable composition contains, as the (C) nonpolymerizable compound, a compound which is substantially constituted only with a polyalkylene glycol structure.

The polyalkylene glycol structure preferably has 3 to 1,000 alkylene glycol constituent units, more preferably has 4 to 500 alkylene glycol constituent units, even more preferably has 5 to 100 alkylene glycol constituent units, and most preferably has 5 to 50 alkylene glycol constituent units.

The weight average molecular weight (Mw) of the component (C) is preferably 150 to 10,000, more preferably 200 to 5,000, even more preferably 500 to 4,000, and still more preferably 600 to 3,000.

The state in which the (C) nonpolymerizable compound substantially does not contain a fluorine atom and a silicon atom means that the total content of a fluorine atom and a silicon atom is equal to or less than 1%, for example. It is preferable that the (C) nonpolymerizable compound does not at all contain a fluorine atom and a silicon atom. If the compound does not contain a fluorine atom and a silicon atom, the compatibility with the polymerizable compound is improved, and particularly in a composition not containing a solvent, uniformity of coating, pattern formability at the time of imprinting, and line-edge roughness after dry etching become excellent.

In the (C) nonpolymeriable compound, at least one hydroxyl group is present on a terminal, or the hydroxyl group is etherified. If at least one hydroxyl group is present on a terminal of the compound, or the hydroxyl group is etherified, it is possible to use a group in which a hydrogen atom of the terminal hydroxyl group is substituted, even though the other terminal is composed of a hydroxyl group. As the group in which a hydrogen atom of the terminal hydroxyl group may be substituted, an alkyl group (that is, polyalkylene glycol alkyl ether) and an acyl group (that is, polyalkylene glycol ester) are preferable, and polyalkylene glycol in which all the terminals are composed of hydroxyl groups is more preferable. It is possible to preferably use a compound having a plurality of (preferably two or three) polyalkylene glycol chains linked through a linking group, and the polyalkylene glycol chains preferably have a linear structure which is not branched. Particularly, diol-type polyalkylene glycol is preferable.

Preferred examples of the (C) nonpolymerizable compound specifically include polyethylene glycol, polypropylene glycol, and monomethyl or dimethyl ether, monooctyl or dioctyl ether, monononyl or dinonyl ether, monodecyl or didecyl ether, monostearic acid ester, monooleic acid ester, monoadipic acid ester, and monosuccinic acid ester of polyethylene glycol and polypropylene glycol.

The content of the (C) nonpolymerizable compound is preferably 0.1% by mass to 20% by mass, more preferably 0.2% by mass to 10% by mass, even more preferably 0.5% by mass to 5% by mass, and most preferably 0.5% by mass to 3% by mass, with respect to the total amount of the composition excluding the solvent.

—Antioxidant—

The photocurable composition used in the present invention may contain a known antioxidant. The content of the antioxidant used in the present invention is, for example, 0.01% by mass to 10% by mass, and preferably 0.2% by mass to 5% by mass, with respect to the amount of the polymerizable compound. When two or more kinds of antioxidants are used, the total amount thereof is within the range described above.

The antioxidant inhibits fading caused by heat or light irradiation and inhibits fading caused by various oxidative gases such as ozone, active oxygen, $NO_x$, and $SO_x$ (x is an integer). Particularly, in the present invention, the addition of the antioxidant has an advantage of being able to prevent coloring of the cured film and to reduce the decrease in the film thickness resulting from decomposition. Examples of the antioxidant include hydrazides, a hindered amine-based antioxidant, a nitrogen-containing heterocyclic mercapto-based compound, a thioether-based antioxidant, a hindered phenol-based antioxidant, ascorbic acids, zinc sulfate, thiocyanates, a thiourea derivative, sugars, nitrite, sulfite, thiosulfate, a hydroxylamine derivative, and the like. Among these, from the viewpoint of the coloring of the cured film and the reduction in the film thickness, a hindered phenol-based antioxidant and a thioether-based antioxidant are particularly preferable.

Examples of commercially available products of the antioxidant include Irganox 1010, 1035, 1076, and 1222 (trade names, all manufactured by Ciba-Geigy Japan Limited.), Antigene P, 3C, FR, Sumilizer S, and Sumilizer GA80 (trade names, all manufactured by SUMITOMO CHEMICAL Co., Ltd.), Adeka Stab AO70, AO80, and AO503 (trade names, all manufactured by ADEKA CORPORATION), and the like. One kind of these antioxidants may be used singly, or these antioxidants may be used by being mixed together.

—Polymerization Inhibitor—

The photocurable composition used in the present invention may further contain a polymerization inhibitor. If the composition contains the polymerization inhibitor, the change in viscosity over time, the occurrence of foreign substances, and the deterioration of the pattern formability tend to be able to be inhibited. The content of the polymerization inhibitor is 0.001% by mass to 1% by mass, more preferably 0.005% by mass to 0.5% by mass, and even more preferably 0.008% by mass to 0.05% by mass, with respect to the total amount of the polymerizable compound. If the polymerization inhibitor is mixed in the composition in an appropriate amount, it is possible to inhibit the change in viscosity over time while maintaining the curing sensitivity at a high level. The polymerization inhibitor may be contained from the first in the polymerizable compound to be used, or may be added to the composition later.

Examples of preferred polymerization inhibitors which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxyamine cerium (III) salt, phenothiazine, phenoxazine, 4-methoxynaphthol, a 2,2,6,6-tetramethylpiperidin-1-oxyl free radical, 2,2,6,6-tetramethylpiperidine, a 4-hydroxy-2,2,6,6-tetramethylpiperidin-1-oxyl free radical, nitrobenzene, dimethylaniline, and the like. Among these, phenothiazine, 4-methoxynaphthol, a 2,2,6,6-tetramethylpiperidin-1-oxyl free radical, 2,2,6,6-tetramethylpiperidine, and a 4-hydroxy-2,2,6,6-tetramethylpiperidin-1-oxyl free radical which bring about a high effect even in the presence of oxygen are particularly preferable.

Regarding the details of the aforementioned polymerizable monomer, photopolymerization initiator, antioxidant, nonpolymerizable compound, polymerization inhibitor, ultraviolet absorber, and other components, the corresponding description in WO2011/126101A, WO2013/051735A, JP2012-041521A, and JP2013-093552A can be referred to, the contents of which are incorporated in the specification of the present application.

<Pattern Formation Method>

The pattern formation method of the present invention includes discharging the photocurable composition onto a substrate or a mold by the discharge method described above, and irradiating the photocurable composition with light in a state in which the composition is interposed between the mold and the substrate. Accordingly, the pattern formation method of the present invention is suited for forming a fine pattern such as a nanoimprinted pattern.

More specifically, the pattern formation method of the present invention includes a step of discharging a photocurable composition onto a substrate or a mold by the discharge method of the present invention and pressing the mold or the substrate on the surface of the photocurable composition layer, and a step of irradiating the photocurable composition layer with light. The step of pressing the substrate or the mold can be preferably performed in a noble gas atmosphere. It is desirable that the exposure amount is within a range of 5 mJ/cm$^2$ to 1,000 mJ/cm$^2$.

Herein, the photocurable composition used in the present invention is preferably cured by being further heated after being irradiated with light. Furthermore, a composition for an underlayer film may be provided between the substrate and the photocurable composition layer.

Regarding the details of the pattern formation method, the description in paragraphs "0103" to "0115" of JP2010-109092A (corresponding to US2011/0183127) can be referred to, the contents of which are incorporated in the specification of the present application.

The pattern formation method of the present invention makes it possible to form a fine pattern at low costs and with high accuracy by a photonanoimprinting method. Accordingly, the pattern, which has been formed by using a photolithography technique in the related art, can be formed with higher accuracy and at lower costs. For example, the pattern can also be applied as a permanent film, such as an overcoat layer or an insulating film used in a liquid crystal display (LCD) or the like, a semiconductor integrated circuit, a recording material, or an etching resist of a flat panel display or the like. Particularly, the pattern obtained by the pattern formation method of the present invention has excellent etching properties. Therefore, the pattern can also be preferably used as an etching resist for dry etching using fluorocarbon or the like.

In the permanent film (resist for a structural member), which is used in a liquid crystal display (LCD) or the like, or the resist used for processing a substrate of an electronic material, it is desirable to avoid mixing of ionic impurities of metals or organic substances into the resist as much as possible such that the operation of the product is not hindered. Therefore, the concentration of the ionic impurities of metals or organic substances in the photocurable composition used in the present invention is equal to or less than 1 ppm, and desirably equal to or less than 100 ppb. The concentration is more preferably equal to or less than 10 ppb.

[Pattern]

As described above, the pattern formed by the pattern formation method of the present invention can be used as the permanent film (resist for a structural member) used in a liquid crystal display (LCD) or the like or as an etching resist. After being produced, the permanent film is subjected to bottling so as to be put into a container such as a gallon bottle or a coated bottle, transported, and stored. In this case, in order to prevent deterioration of the film, the inside of the container may be purged with inert nitrogen, argon, or the like. Furthermore, the permanent film may be transported and stored at normal temperature. However, in order to further prevent the alteration of the permanent film, the temperature may be controlled within a range of −20° C. to 0° C. Naturally, it is preferable to block light to such a level that a reaction does not occur.

The pattern formed by the pattern formation method of the present invention is also useful as an etching resist. When the pattern is used as an etching resist, first, for example, as a substrate, a silicon wafer on which a thin film of $SiO_2$ or the like is used, and a fine nano-order pattern is formed on the substrate by the pattern formation method of the present invention. Then, etching is performed by using etching gas such as hydrogen fluoride in a case of wet etching or $CF_4$ in a case of dry etching, and in this way, an intended pattern can be formed on the substrate. The pattern exhibits excellent etching resistance especially to dry etching.

EXAMPLES

Hereinafter, the present invention will be more specifically described by illustrating examples. The materials, the amount and proportion thereof, the content of processing, and the procedure of processing described in the following examples can be appropriately modified as long as the modification does not depart from the gist of the present invention. Therefore, the scope of the present invention is not limited to the following specific examples.

<Preparation of Composition>

The polymerizable monomer, the photopolymerization initiator, and the fluorine-containing material shown in the following tables were mixed together, and as a polymerization inhibitor, a 4-hydroxy-2,2,6,6-tetramethylpiperidin-1-oxyl free radical (manufactured by Tokyo Chemical Industry Co., Ltd.) was further added thereto in an amount of 200 ppm (0.02% by mass) with respect to the amount of the monomer. The resultant was filtered through a 0.1 μm PTFE filter, thereby preparing a composition. In the following tables, the amount of the components were expressed as a mass ratio.

[(A) Polymerizable Monomer]

(A-1) Synthesized from the following compound α,α′-dichloro-p-xylene and acrylic acid

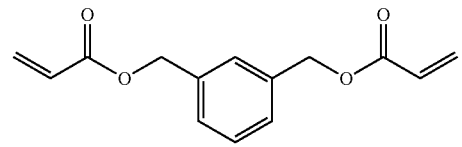 [SMILES: C=CC(=O)OCc1cccc(COC(=O)C=C)c1]

(A-2) 2-Phenoxyethyl acrylate (manufactured by OSAKA ORGANIC CHEMICAL INDUSTRY LTD., Viscoat #192)

(A-3) Neopentyl glycol diacrylate (manufactured by Nippon Kayaku Co., Ltd., Kayarad NPGDA)

(A-4) Benzyl acrylate (manufactured by OSAKA ORGANIC CHEMICAL INDUSTRY LTD., Viscoat #160)

[(B) Photopolymerization Initiator]

(B-1) Irgacure OXE-01 (BASF)

[(C) Fluorine-Containing Material]

(C-1) Ftergent 251 (perfluoroalkenyl structure having a branch, manufactured by NEOS COMPANY LIMITED)

(C-2) Ftergent 212M (perfluoroalkenyl structure having a branch, manufactured by NEOS COMPANY LIMITED)

(C-3) Ftergent 215M (perfluoroalkenyl structure having a branch, manufactured by NEOS COMPANY LIMITED)

(C-4) Ftergent 250 (perfluoroalkenyl structure having a branch, manufactured by NEOS COMPANY LIMITED)

(C-5) Ftergent 222F (perfluoroalkenyl structure having a branch, manufactured by NEOS COMPANY LIMITED)

(C-6) A compound represented by the following formula in which n is 10 to 20 and * is a position where the compound is bonded to an oxygen atom

[Chemical structure of C-6]

(C-7) A compound represented by the following formula in which n is 10 to 20 and * is a position where the compound is bonded to an oxygen atom

[Chemical structure of C-7]

(C-8) Megaface F444 (linear perfluoroalkyl structure, manufactured by DIC Corporation)

(C-9) Capstone FS-3100 (linear perfluoroalkyl structure, manufactured by DuPont)

(C-10) Zonyl FSO-100 (linear perfluoroalkyl structure, manufactured by DuPont)

(C-11) Zonyl FSN-100 (linear perfluoroalkyl structure, manufactured by DuPont)

(C-12) DSN-403N (linear perfluoroalkyl structure, manufactured by DAIKIN INDUSTRIES, ltd.)

(C-13) Surflon S-242 (linear perfluoroalkyl structure, manufactured by AGC SEIMI CHEMICAL CO., LTD.)

(C-14) Megaface F556 (oligomer having a linear perfluoroalkyl structure on a side chain, manufactured by DIC Corporation)

(C-15) PolyFox PF-636 (oligomer having a linear perfluoroalkyl structure on a side chain and a polypropylene oxide structure, manufactured by OMNOVA Solutions Inc.)

(C-16) Olefine E1010 (manufactured by Nissin Chemical Co., Ltd.)

[(D) Solvent]

(D-1) Propylene glycol 1-monomethyl ether 2-acetate (boiling point: 140° C.)

[Surface Tension of Composition]

The surface tension of the composition was measured by using a tensiometer SURFACE TENS-IOMETER CBVP-A3 manufactured by Kyowa Interface Science Co., LTD. and a platina plate at a temperature of 25±0.2° C. The surface tension was expressed by using a unit of mN/m.

[Viscosity of Composition]

The viscosity of the composition (not yet being cured) was measured by an RE-80L type rotary viscometer manufactured by TOKI SANGYO CO., LTD. at a temperature of 25±0.2° C.

The viscosity was measured at a rotation frequency of 50 rpm and expressed by using a unit of mPa·s.

[Inkjet (IJ) Discharge Properties]

By using an inkjet printer DMP-2831 manufactured by FUJIFILM Dimatix, Inc., the composition of which the temperature was adjusted to be 25° C. was discharged in the form of liquid droplets onto a silicon wafer, in an amount of 1 pL per nozzle. In this way, the silicon wafer was coated with the composition such that the liquid droplets are arranged in the form of squares at an interval of 100 μm.

The discharged state was observed by using a CCD camera, and the deviation of the discharged liquid droplets (discharged in an area of 5 mm×5 mm, 2,500 dots) from the square arrangement was evaluated.

By changing the amount of liquid droplets into 6 pL, the same evaluation was performed.

A: All of the nozzles stably discharged the composition.

B: Flying curving occurred in some of the nozzles, and the contamination of the discharge port was observed.

C: Flying curving occurred in 50% or more of the nozzles, and the contamination of the discharge port was observed.

[Evaluation of Release Force]

As a mold, a quartz mold with lines and spaces having a line width of 30 nm and a depth of 60 nm was used. By using an inkjet printer DMP-2831 manufactured by FUJIFILM Dimatix, Inc. as an inkjet device, the aforementioned composition was discharged onto a silicon wafer by an inkjet method, and then the mold was brought into contact with the composition in a helium atmosphere. From the surface of the mold, the composition was exposed to light from a high-pressure mercury lamp under a condition of 100 mJ/cm$^2$, and then the mold was released, thereby obtaining a pattern. The residual film of the pattern had a thickness of 10 nm.

At this time, the force (release force F) necessary for releasing the mold was measured.

A: F≤12N

B: 12N<F≤15N

C: F>15N

[Pattern Formability]

The pattern formed as described in Evaluation of release force was observed and evaluated as below.

A: It was confirmed that the pattern was excellently transferred over the entire surface.

B: The deletion of the pattern was observed in a portion.

C: In addition to the deletion of the pattern, the collapse of the pattern was observed.

The results are shown in the following tables.

TABLE 1

|     | Example 1 | Example 2 | Example 3 | Example 4 | Example 5 | Example 6 | Example 7 | Example 8 | Example 9 | Example 10 | Example 11 | Example 12 | Example 13 | Example 14 |
|-----|-----------|-----------|-----------|-----------|-----------|-----------|-----------|-----------|-----------|------------|------------|------------|------------|------------|
| A-1 | 47 | 44 | 47 | 44 | 47 | 44 | 47 | 44 | 47 | 44 | 47 | 44 | 47 | 44 |
| A-2 | 47 | 44 | 47 | 44 | 47 | 44 | 47 | 44 | 47 | 44 | 47 | 44 | 47 | 44 |
| A-3 |  |  |  |  |  |  |  |  |  |  |  |  |  |  |
| A-4 |  |  |  |  |  |  |  |  |  |  |  |  |  |  |
| B-1 | 2 | 2 | 2 | 2 | 2 | 2 | 2 | 2 | 2 | 2 | 2 | 2 | 2 | 2 |

TABLE 1-continued

|  | Example 1 | Example 2 | Example 3 | Example 4 | Example 5 | Example 6 | Example 7 | Example 8 | Example 9 | Example 10 | Example 11 | Example 12 | Example 13 | Example 14 |
|---|---|---|---|---|---|---|---|---|---|---|---|---|---|---|
| C-1 | 4 | 10 | | | | | | | | | | | | |
| C-2 | | | 4 | 10 | | | | | | | | | | |
| C-3 | | | | | 4 | 10 | | | | | | | | |
| C-4 | | | | | | | 4 | 10 | | | | | | |
| C-5 | | | | | | | | | 4 | 10 | | | | |
| C-6 | | | | | | | | | | | 4 | 10 | | |
| C-7 | | | | | | | | | | | | | 4 | 10 |
| Surface tension | 29.4 | 29 | 31.5 | 30.3 | 32.5 | 31 | 28.7 | 28.1 | 28.5 | 28 | 29.5 | 29 | 27.5 | 27 |
| Viscosity of composition | 10.0 | 11.2 | 10.1 | 11.2 | 10.2 | 11.4 | 10.2 | 11.4 | 10.4 | 11.6 | 10.1 | 11.1 | 10.0 | 11.0 |
| IJ discharge properties (6 pL) | A | A | A | A | A | A | A | A | A | A | A | A | A | A |
| IJ discharge properties (1 pL) | A | A | A | A | A | A | A | A | A | A | A | A | A | A |
| Release force | A | A | A | A | A | A | A | A | A | A | A | A | A | A |
| Pattern formability | A | A | A | A | A | A | A | A | A | A | A | A | A | A |

TABLE 2

|  | Comparative example 1 | Comparative example 2 | Comparative example 3 | Comparative example 4 | Comparative example 5 | Comparative example 6 | Comparative example 7 | Comparative example 8 |
|---|---|---|---|---|---|---|---|---|
| A-1 | | | | | | | | |
| A-2 | | | | | | | | |
| A-3 | 47 | 44 | 47 | 44 | 47 | 44 | 47 | 44 |
| A-4 | 47 | 44 | 47 | 44 | 47 | 44 | 47 | 44 |
| B-1 | 2 | 2 | 2 | 2 | 2 | 2 | 2 | 2 |
| C-1 | | | | | | | | |
| C-8 | 4 | 10 | | | | | | |
| C-9 | | | 4 | 10 | | | | |
| C-10 | | | | | 4 | 10 | | |
| C-11 | | | | | | | 4 | 10 |
| C-12 | | | | | | | | |
| C-13 | | | | | | | | |
| C-14 | | | | | | | | |
| C-15 | | | | | | | | |
| C-16 | | | | | | | | |
| D-1 | | | | | | | | |
| Surface tension | 18 | 15 | 19.5 | 16.2 | 14 | 13.8 | 14.3 | 14 |
| Viscosity of composition | 8.1 | 8.9 | 8.1 | 8.9 | 8.4 | 8.8 | 8.4 | 8.8 |
| IJ discharge properties (6 pL) | C | C | B | C | C | C | C | C |
| IJ discharge properties (1 pL) | C | C | C | C | C | C | C | C |
| Release force | A | A | B | A | C | C | C | C |
| Pattern formability | A | A | A | A | B | B | B | B |

|  | Comparative example 9 | Comparative example 10 | Comparative example 11 | Comparative example 12 | Comparative example 13 | Comparative example 14 | Comparative example 15 |
|---|---|---|---|---|---|---|---|
| A-1 | | | | | | | |
| A-2 | | 47 | 44 | 47 | 44 | 47 | 44 | 47 |
| A-3 | 47 | 44 | 47 | 44 | 47 | 44 | 47 |
| A-4 | 47 | 44 | 47 | 44 | 47 | 44 | 47 |
| B-1 | 2 | 2 | 2 | 2 | 2 | 2 | 2 |
| C-1 | | | 2 | 2 | | | |
| C-8 | | | | | | | |
| C-9 | | | | | | | |

TABLE 2-continued

|  | | | | | | | |
|---|---|---|---|---|---|---|---|
| C-10 | | | | | | | |
| C-11 | | | | | | | |
| C-12 | 4 | 10 | | | | | |
| C-13 | | | 4 | 10 | | | |
| C-14 | | | | | 4 | 10 | |
| C-15 | | | | | | | 4 |
| C-16 | | | | | | | |
| D-1 | | | | | | | |
| Surface tension | 14.1 | 13.5 | 19 | 16 | 16.5 | 14.9 | 39.8 |
| Viscosity of composition | 8.2 | 9.0 | 8.1 | 9.0 | 9.2 | 10.2 | 8.0 |
| IJ discharge properties (6 pL) | C | C | B | C | C | C | C |
| IJ discharge properties (1 pL) | C | C | C | C | C | C | C |
| Release force | B | A | B | A | C | C | C |
| Pattern formability | A | A | A | A | A | A | B |

TABLE 3

| | Comparative example 16 | Comparative example 17 | Comparative example 18 | Comparative example 19 | Comparative example 20 | Comparative example 21 | Comparative example 22 | Comparative example 23 | Comparative example 24 | Comparative example 25 |
|---|---|---|---|---|---|---|---|---|---|---|
| A-1 | | | | | | | | | | |
| A-2 | | | | | | | | | | |
| A-3 | 47 | 44 | 48 | 48 | 48 | 48 | 11.75 | 11.75 | 11.75 | 11.75 |
| A-4 | 47 | 44 | 48 | 48 | 48 | 48 | 11.75 | 11.75 | 11.75 | 11.75 |
| B-1 | 2 | 2 | 2 | 2 | 2 | 2 | 0.5 | 0.5 | 0.5 | 0.5 |
| C-1 | | | 2 | | | | 4 | | | |
| C-2 | | | | 2 | | | | 4 | | |
| C-3 | | | | | | | | | | |
| C-4 | | | | | | | | | | |
| C-5 | | | | | | | | | | |
| C-6 | | | | | | | | | | |
| C-7 | | | | | | | | | | |
| C-8 | | | | | 2 | | | | 4 | |
| C-9 | | | | | | | | | | 4 |
| C-10 | | | | | | | | | | |
| C-11 | | | | | | | | | | |
| C-12 | | | | | | | 2 | | | |
| C-13 | | | | | | | | | | |
| C-14 | | | | | | | | | | |
| C-15 | 4 | 10 | | | | | | | | |
| D-1 | | | | | | | 75 | 75 | 75 | 75 |
| Surface tension | 18.1 | 15.3 | 30.3 | 33.5 | 27.5 | 19.1 | 29.1 | 30.3 | 19.1 | 20.2 |
| Viscosity of composition | 9.3 | 10.4 | 7.8 | 7.8 | 7.8 | 7.8 | <2.0 | <2.0 | <2.0 | <2.0 |
| IJ discharge properties (6 pL) | C | C | A | A | A | B | A | A | C | C |
| IJ discharge properties (1 pL) | C | C | A | A | B | C | B | B | C | C |
| Release force | C | B | C | C | C | C | B | B | B | B |
| Pattern formability | A | A | B | B | B | B | C | C | C | C |

As is evident from the results described above, it was understood that when discharging is performed by using a composition satisfying the conditions of the present invention, even if the composition is discharged in the form of liquid droplets in such an amount that the droplets have a size of equal to or less than 6 pL, the obtained pattern can be appropriately released from a mold, and an excellent pattern can be formed. In contrast, it was understood that when the surface tension of the composition is beyond a range of 25 mN/m to 35 mN/m (Comparative examples 1 to 17, 21, 24, and 25), the inkjet discharge properties become poor. Furthermore, it was understood that when the mixing ratio of the fluorine-containing material is less than 4% by mass of the composition (Comparative examples 18 to 21), a strong release force is required, and the release properties deteriorate. In addition, it was understood that when the content of the solvent having a boiling point of equal to or less than 200° C. is greater than 5% by mass of the composition (Comparative examples 22 to 25), the pattern formability deteriorates.

INDUSTRIAL APPLICABILITY

Particularly, by using the pattern formation method according to the present invention, it is possible to form a pattern (particularly, a nano-order pattern) necessary for producing a semiconductor integrated circuit, recording media, and the like. Furthermore, the pattern can be used for permanent structures of a semiconductor wiring layer, a microelectromechanical system (MEMS), a nanodevice, an optical device, a material for a flat panel display, a thin film transistor (TFT), and the like.

What is claimed is:

1. An inkjet discharge method comprising discharging a photocurable composition in the form of liquid droplets having a size f-equal to or less than 6 pL,
wherein the photocurable composition contains a fluorine-containing material in a proportion of equal to or greater than 4% by mass of the photocurable composition,
wherein the photocurable composition has a surface tension of 25 mN/m to 35 mN/m, and
wherein the photocurable composition contains a solvent having a boiling point of equal to or less than 200° C. in an amount of equal to or less than 5% by mass of the photocurable composition,
wherein the fluorine-containing material is a compound having a structure represented by the following Formula (I) or (II), $$Rf-X-(AO)_n-R \quad (I)$$

$$Rf-X-(AO)_n-X-Rf \quad (II)$$

in the formulae, each Rf represents a group having a branched fluorocarbon structure; X represents a group selected from an alkylene group having 1 to 10 carbon atoms, an arylene group having 6 to 10 carbon atoms, an ester group, an amide group, a sulfonic acid ester group, a sulfonamide group, an ether group and combinations thereof; A represents an alkylene group; n represents an integer of equal to or greater than 2; and R represents a hydrogen atom, an acrylate group, or a methacrylate group.

2. The inkjet discharge method according to claim 1, wherein the photocurable composition is a composition for imprinting.

3. The inkjet discharge method according to claim 1, wherein the fluorine-containing material has a branched fluorocarbon structure.

4. The inkjet discharge method according to claim 1, wherein Rf is a branched perfluoroalkyl group or a branched perfluoroalkenyl group.

5. The inkjet discharge method according to claim 1, wherein the photocurable composition has a viscosity of equal to or less than 20 mPa·s at a temperature of 25° C.

6. The inkjet discharge method according to claim 1, wherein the amount of a polymerizable monomer contained in the photocurable composition is equal to or greater than 70% by mass of the composition, and the amount of a component having a molecular weight of greater than 2,000 mixed in the composition is equal to or less than 3% by mass of the composition.

7. The inkjet discharge method according to claim 1, wherein the amount of an ethylenically unsaturated double bond-containing polymerizable monomer contained in the photocurable composition is equal to or greater than 70% by mass of the composition, and the amount of a component having a molecular weight of greater than 2,000 mixed in the composition is equal to or less than 3% by mass of the composition.

8. A pattern formation method comprising:
discharging a photocurable composition onto a substrate or a mold by an inkjet discharge method; and
irradiating the photocurable composition with light in a state in which the photocurable composition is interposed between the mold and the substrate,
where the inkjet discharge method comprises discharging a photocurable composition in the form of liquid droplets having a size of equal to or less than 6 pL,
wherein the photocurable composition contains a fluorine-containing material in a proportion of equal to or greater than 4% by mass of the photocurable composition,
wherein the photocurable composition has a surface tension of 25 mN/m to 35 mN/m, and
wherein the photocurable composition contains a solvent having a boiling point of equal to or less than 200° C. in an amount of equal to or less than 5% by mass of the photocurable composition.

* * * * *